US007542507B2

(12) United States Patent
Sohn

(10) Patent No.: US 7,542,507 B2
(45) Date of Patent: Jun. 2, 2009

(54) DECISION FEEDBACK EQUALIZATION INPUT BUFFER

(75) Inventor: Young-Soo Sohn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 715 days.

(21) Appl. No.: 11/040,808

(22) Filed: Jan. 21, 2005

(65) Prior Publication Data

US 2005/0265440 A1 Dec. 1, 2005

(30) Foreign Application Priority Data

May 27, 2004 (KR) .................... 10-2004-0037966

(51) Int. Cl.
*H04B 3/46* (2006.01)
*H04B 17/00* (2006.01)
*H04Q 1/20* (2006.01)
*H03H 7/30* (2006.01)
*H03H 7/40* (2006.01)
*H03K 5/159* (2006.01)

(52) U.S. Cl. ..................................................... 375/233

(58) Field of Classification Search .................. 375/233
See application file for complete search history.

(56) References Cited

U.S. PATENT DOCUMENTS

| 5,233,635 | A | * | 8/1993 | Henriksson et al. | ......... 375/346 |
| 5,307,375 | A | | 4/1994 | Wu et al. | |
| 5,428,644 | A | * | 6/1995 | Kohonen | ..................... 375/340 |
| 5,692,011 | A | | 11/1997 | Nobakht et al. | ............. 375/233 |
| 6,556,637 | B1 | | 4/2003 | Moriuchi | |
| 6,671,314 | B1 | | 12/2003 | Abe et al. | .................... 375/233 |

| 2003/0016764 | A1 | * | 1/2003 | Brossier et al. | ............. 375/316 |
| 2004/0032905 | A1 | | 2/2004 | Dittrich et al. | ............... 375/233 |
| 2005/0254572 | A1 | * | 11/2005 | Garg et al. | ................... 375/233 |

OTHER PUBLICATIONS

Young-Soo Sohn; Seung-Jun Bae; Hong-June Park; Chang-Hyun Kim; Soo-In Cho; "A 2.2 Gbpps CMOS look-ahead DFE receiver for multidrop channel with pin-to-pin time skew compensation," Proceedings of the IEEE Custom Integrated Circuits Conference, Sep. 21-24, 2003 pp. 473-476.*

(Continued)

*Primary Examiner*—David C Payne
*Assistant Examiner*—Nader Bolourchi
(74) *Attorney, Agent, or Firm*—Mills & Onello LLP

(57) ABSTRACT

In a decision feedback equalization (DFE) input buffer, timing and voltage errors, such as those caused by inter-symbol interference (ISI), are fully compensated. A variable equalizing coefficient is applied that accommodates, and compensates for, a range of timing errors TE or voltage errors VE that may be generated over a range of operating conditions. In this manner, accurate compensation is achieved, allowing for greater signal reliability and higher inter-circuit transfer rates. A decision feedback equalization (DFE) input buffer includes an equalizer that amplifies a difference in voltage level between an input signal and an oversampled signal in response to a variable equalizing control signal, the equalizer generating an amplified output signal. A sampling unit samples the amplified output signal in response to a sampling clock signal to generate the oversampled signal. A phase detector generates a timing control signal for controlling the timing of the activation of the sampling clock signal in response to a phase of the oversampled signal. An equalizing controller modifies the variable equalizing control signal in response to the timing control signal.

53 Claims, 16 Drawing Sheets

OTHER PUBLICATIONS

Sohn, Young-Soo, et al., "1 1.35Bbps Decision Feedback Equalizing Receiver fro the SSTL SDRAM Interface with 2X Over-Sampling Phase Detector for Skew Compensation Between Clock and Data," ESSCIRC 2002, pp. 787-790.

Stonick, John T., "An Adaptive PAM-4 5-Gb/s Backplane Transceiver in 0325-μm CMOS," IEEE Journal of Solid-State Circuits, vol. 38, No. 3, Mar. 2003, pp. 436-443.

* cited by examiner

DECISION FEEDBACK EQUALIZATION INPUT BUFFER

RELATED APPLICATIONS

This application claims the benefit of Korean Patent Application No. 2004-37966, filed on May 27, 2004, the disclosure of which is hereby incorporated herein by reference in its entirety.

BACKGROUND OF THE INVENTION

Communication between integrated circuit systems inevitably results in the generation of timing errors and voltage errors that occur in the inter-chip transmitted signals. The common source of such errors is inter-symbol interference (ISI), which is caused by limitations in the channel bandwidth. To accomplish high-speed inter-chip communication, the effect of ISI should be minimized.

Decision feedback equalizer (DFE) input buffers are employed in contemporary systems to mitigate the harmful effects of ISI. However, conventional DFE input buffers cannot efficiently compensate for timing and voltage errors caused by ISI, since the equalization coefficients in such buffers are fixed.

FIG. 1 is a waveform diagram illustrating the effects of timing errors and voltage errors caused by ISI. Waveforms A and B represent input signals as received by a receiver circuit. Signal B represents the normal input signal, that is, an input signal that is received without ISI error. Signal A represents an erroneous input signal that has experienced ISI. It can be seen that the erroneous input signal A experiences a timing error TE in the form of a timing delay, and a voltage error VE in the form of a reduced input voltage. Both the timing error TE and the voltage error VE are introduced as a result of ISI during the inter-circuit transfer of the signals.

FIG. 2 is a block diagram of a conventional DFE input buffer 11. In the conventional embodiment, an equalizer 10 amplifies the difference between an input signal IN including an ISI component, and an odd oversampled output signal OD multiplied by an equalizing coefficient α to compensate for the ISI component. As a result, an even amplified output signal ed is generated. In other words, the even amplified output signal ed=IN−(α*OD), where α*OD represents the ISI component, and the ISI component is thus reduced in the even amplified output signal ed.

At the same time, the equalizer 10 amplifies the sum between the input signal IN or INB (where "xB" represents throughout the present specification an inverted signal of signal "x") including the ISI component, and an even oversampled output signal EDB or ED multiplied by the equalizing coefficient α to compensate for the ISI component. As a result, an odd amplified output signal od is generated. In other words, the odd amplified output signal od=IN−(α*ED), where α*ED represents the ISI component, and the ISI component is thus reduced in the odd amplified output signal od. The equalizer 10 thus includes a circuit that generates the even amplified output signals ed or edB and a circuit that generates the odd amplified output signals od or odB. An equalization circuit for generating the even output signals ed/edB is described below with reference to FIG. 3. An equalization circuit for generating the odd amplified output signals od/odB is similar in construct to the circuit of FIG. 3.

An oversampler 12 sequentially samples the even amplified output signal ed in response to each of sampling clock signals c0 and c90 and sequentially generates even oversampled output signals ED and ED90. Also, the oversampler 12 sequentially samples the odd amplified output signal od in response to each of sampling clock signals c90 and c180 and sequentially generates first and second odd oversampled output signals OD90 and OD.

Sampling clock signals c0 and c90 have a phase difference of 90 degrees. A phase detector 14 determines the phase difference between the even oversampled output signals ED and ED90 and determines the phase difference between the odd oversampled output signals OD and OD90, and, in response, activates an up control signal up or a down control signal dn, which, in turn, are transferred to a counter 16. The phase difference is representative of the phase relationship between the data clock of the received data and the sampling clock used by the oversampler 12 to sample the incoming data.

The counter 16 increases a count output signal cout, for example comprising a plurality of digital bits, when the up control signal up is active. The counter 16 decreases the count output signal cout, when the down control signal dn is active.

The timing controller 18 adjusts activation timing, or phase, of the sampling clock signals (c0, c90, c180, c270), in response to the count output signal cout. For example, if the value of the count output signal cout is increased to a value that is higher than a previous value, for example 00 . . . 01→00 . . . 10, the activation timing of each of the sampling clock signals (c0, c90, c180, c270) is adjusted such that it is activated at a later time than before. However, if the value of the count output signal cout is decreased to a lower value, the activation timing of each of the sampling clock signals (c0, c90, c180, c270) is adjusted such that it is activated at an earlier time than before. In this manner, the activation timing of the sampling clock signals (c0, c90, c180, c270) is adjusted by the timing controller 18 in order to compensate for a centering error that may exist between the input signal IN and the sampling clock signals (c0, c90, 180, c270) in the oversampler 12.

A clock generator 20 generates several reference clock signals (c1, c2, cn) in response to an input clock signal CLK. The reference clock signals (c1, c2, cn) have respectively different phases, from which the sampling clock signals (c0, c90, c180, c270) are generated.

FIG. 3 is a schematic diagram of the equalizer 10 component of the conventional DFE input buffer of FIG. 2. In the equalizer 10, the value of the received input signal IN is amplified to compensate for voltage error in the input signal IN. To accomplish this, a conventional equalizer has a fixed equalizing coefficient α having a value that is predetermined. In the equalizer circuit of FIG. 3, load transistors P1 and P2 operate as a load resistance and could be replaced by resistors. Differential transistors N1 and N2 receive the IN and INB signals respectively. Differential transistors N3 and N4 receive the ODB and OD signals respectively. Current source transistors N5 and N6 draw the respective currents I1 and I2 flowing through the first and second differential units. The value of the fixed equalizing coefficient α is determined as a function of the relative sizes of the channel widths of transistors N5 and N6, which are fixed. In the circuit, voltage value Vb represents a bias voltage that is constant in value. Since the value of the equalizing coefficient α is fixed, the equalizer circuit 10 operates in a constant condition, irrespective of whether timing error TE or voltage error VE exists in the input signal IN. For this reason, the conventional equalizer circuit is incapable of accurately compensating for timing errors or voltage errors in the input signal over a range of operating conditions.

SUMMARY OF THE INVENTION

The present invention is directed to a semiconductor device that includes a decision feedback initialization buffer, and, more particularly, to a decision feedback equalization (DFE) input buffer in which timing and voltage errors, such as those caused by inter-symbol interference (ISI), are fully compensated. The present invention accomplishes this by applying a variable equalizing coefficient that accommodates, and compensates for, a range of timing errors TE or voltage errors VE that may be generated over a range of operating conditions. In this manner, accurate compensation is achieved, allowing for greater signal reliability and higher inter-circuit transfer rates.

In one aspect, the present invention is directed to a decision feedback equalization (DFE) input buffer. An equalizer amplifies a difference in voltage level between an input signal and an oversampled signal in response to a variable equalizing control signal, the equalizer generating an amplified output signal. A sampling unit samples the amplified output signal in response to a sampling clock signal to generate the oversampled signal. A phase detector generates a timing control signal for controlling the timing of the activation of the sampling clock signal in response to a phase of the oversampled signal. An equalizing controller modifies the variable equalizing control signal in response to the timing control signal.

In one embodiment, the equalizer generates an even amplified output signal and an odd amplified output signal as the amplified output signal. The sampling unit samples the even amplified output signal with a first sampling clock and a second sampling clock, the first and second sampling clocks being 90 degrees out-of-phase with respect to each other, and, in response, generates a first even oversampled signal and a second even oversampled signal. The sampling unit further samples the odd amplified output signal with the second sampling clock and a third sampling clock, the second and third sampling clocks being 90 degrees out-of-phase with respect to each other, and, in response, generates a first odd oversampled signal and a second odd oversampled signal. The phase detector determines whether a phase difference exists between the first even oversampled signal and the second even oversampled signal, and determines whether a phase difference exists between the first odd oversampled signal and the second odd oversampled signal, and, in response, generates the timing control signal. This determination can be made in response to one of the first sampling clock, the second sampling clock, the third sampling clock, and a fourth sampling clock that is 90 degrees out-of-phase with the third sampling clock.

The timing control signal comprises a lock control signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals. The equalizing controller adjusts the variable equalizing control signal in response to statuses of the up control signal, the down control signal, and the lock control signal.

In one embodiment, the equalizing controller comprises an equalizing control signal generator that receives the up control signal, the down control signal and the lock control signal, and, in response, generates an auxiliary up control signal, and an auxiliary down control signal, the auxiliary up control signal being activated when at least one of the up control signal and down control signal is active, and the auxiliary down control signal being activated when the lock control signal is active; and a counter that receives the auxiliary up control signal and the auxiliary down control signal, and, in response, generates the variable equalizing control signal, the counter increasing a value of the variable equalizing control signal upon the auxiliary up control signal being active, and the counter decreasing the value of the variable equalizing control signal upon the auxiliary down control signal being active.

In one embodiment, the amplified output signal comprises an even amplified output signal and an odd amplified output signal; and the oversampled signal comprises a first even oversampled signal, a second even oversampled signal, a first odd oversampled signal and a second odd oversampled signal. The phase detector determines whether a phase difference exists between the first even oversampled signal and the second even oversampled signal, and determines whether a phase difference exists between the first odd oversampled signal and the second odd oversampled signal, and, in response, generates the timing control signal comprising a lock signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals. The equalizing controller modifies the variable equalizer control signal in response to statuses of the up control signal, the down control signal, and the lock control signal. The equalizing controller comprises: an equalizing control signal generator that receives the up control signal, the down control signal and the lock control signal, and, in response, generates an auxiliary up control signal, and an auxiliary down control signal, the auxiliary up control signal being activated when at least one of the up control signal and down control signal is active, and the auxiliary down control signal being activated when the lock control signal is active; and a counter that receives the auxiliary up control signal and the auxiliary down control signal, and, in response, generates the variable equalizing control signal, the counter increasing a value of the variable equalizing control signal upon the auxiliary up control signal being active, and the counter decreasing the value of the variable equalizing control signal upon the auxiliary down control signal being active.

In one embodiment, the equalizing control signal comprises a digital signal having a plurality of bits, and the equalizer includes a transistor bank including a plurality of transistors, each of the transistors being activated in response to a bit of the equalizing control signal, such that the amplified output signal is variably amplified in response to activation statuses of the respective transistors of the transistor bank. The equalizer comprises: a first transistor, one of a source and drain of which is coupled to a first voltage source and the other of the source and drain of which is coupled to a first node; a second transistor and a third transistor coupled in series between the first node and a second voltage source, the second transistor being activated in response to the input signal and the third transistor being activated in response to a first reference voltage; a fourth transistor and a transistor bank coupled in series between the first node and the second voltage source, the fourth transistor being activated in response to an inverted oversampled signal, the transistor bank including a plurality of fifth transistors connected in parallel with each other, each of the fifth transistors being activated in response to a bit of the equalizing control signal, such that the amplified output signal provided at the first node is variably amplified in response to activation statuses of the respective fifth transistors of the transistor bank. The transistor bank further includes a plurality of sixth transistors, each of the sixth transistors being in series with a corresponding fifth transistor, each of the sixth transistors being activated in response to the first reference voltage. In one embodiment, the sixth transistors have different respective channel widths.

In one embodiment, the decision feedback equalization (DFE) input buffer further comprises: a seventh transistor, one of a source and drain of which is coupled to the first voltage source and the other of the source and drain of which is coupled to a second node, and a gate of which is coupled to a gate of the first transistor and to the second voltage source; an eighth transistor coupled between the second node and a junction between the second transistor and the third transistor; and a ninth transistor coupled between the second node and a junction between the fourth transistor and the transistor bank. In one embodiment, the amplified output signal comprises and even amplified output signal and an odd amplified output signal, wherein the even amplified output signal is provided at the first node and wherein the odd amplified output signal is provided at the second node, and wherein an inverted signal of the even amplified output signal is provided at the second node. The eighth transistor is activated in response to an inverted input signal and the ninth transistor is activated in response to an inverted oversampled signal, or alternatively, the eighth transistor is activated in response to a second reference voltage.

In one embodiment, the amplified output signal is provided at the first node and the second node.

The equalizing control signal comprises a digital signal having a plurality of bits, and the equalizer comprises: a first transistor, one of a source and drain of which is coupled to a first voltage source and the other of the source and drain of which is coupled to a first node; a second transistor and a third transistor coupled in series between the first node and a second voltage source, the second transistor being activated in response to the input signal and the third transistor being activated in response to a reference voltage; a fourth transistor and a fifth transistor coupled in series between the first node and the second voltage source, the fourth transistor being activated in response to the oversampled signal, the fifth transistor having a variable current draw in response to a voltage control signal; and a voltage controller for providing the voltage control signal in response to the equalizing control signal. In one embodiment, the input buffer further comprises: a sixth transistor, one of a source and drain of which is coupled to the first voltage source and the other of the source and drain of which is coupled to a second node, and a gate of which is coupled to a gate of the first transistor and to the second voltage source; a seventh transistor coupled between the second node and a junction between the second transistor and the third transistor; and an eighth transistor coupled between the second node and a junction between the fourth transistor and the fifth transistor.

In one embodiment, the sampling unit comprises: a comparator that compares the amplified output signal to a reference voltage and generates a comparison signal; a first sampling register that samples the comparison signal in response to a first sampling clock signal to generate a first oversampled signal; and a second sampling register that samples the comparison signal in response to a second sampling clock signal that has a different phase than the first sampling clock signal to generate a second oversampled signal; wherein the first and second oversampled output signals comprise the oversampled signal. The phase detector comprises: a first detecting register that samples the first oversampled signal in response to a detector sampling clock signal to generate a first bit of a phase detector data signal; a second detecting register that samples the second oversampled signal in response to the detector sampling clock signal to generate a second bit of a phase detector data signal; and a decoder for generating the timing control signal in response to the first and second bits of the phase detector data signal.

In one embodiment, the amplified output signal comprises even and odd amplified output signals and the sampling unit comprises: a first comparator that compares the even amplified output signal to a reference voltage and generates a first comparison signal; a first sampling register that samples the first comparison signal in response to a first sampling clock signal to generate a first even oversampled signal; a second sampling register that samples the first comparison signal in response to a second sampling clock signal that has a different phase than the first sampling clock signal to generate a second even oversampled signal; a second comparator that compares the odd amplified output signal to a reference voltage and generates a second comparison signal; a third sampling register that samples the second comparison signal in response to the second sampling clock signal to generate a first odd oversampled signal; and a fourth sampling register that samples the second comparison signal in response to a third sampling clock signal that has a different phase than the second sampling clock signal to generate a second odd oversampled signal. The phase detector comprises: a first detecting register that samples the first even oversampled signal in response to a detector sampling clock signal to generate a first bit of the phase detector data signal; a second detecting register that samples the second even oversampled signal in response to the detector sampling clock signal to generate a second bit of the phase detector data signal; a third detecting register that samples the second odd oversampled signal in response to the detector sampling clock signal to generate a third bit of the phase detector data signal; and a fourth detecting register that samples the first odd oversampled signal in response to the detector sampling clock signal to generate a fourth bit of the phase detector data signal; and a decoder for generating the timing control signal in response to the phase detector data signal. The timing control signal comprises a lock control signal, an up control signal, and a down control signal, the lock control signal being active when values of the first and second bits are equal and values of the third and fourth bits are equal, the down control signal being active when values of the first and second bits are not equal and values of the third and fourth bits are equal, and the up control signal being active when values of the first and second bits are equal and values of the third and fourth bits are not equal.

In one embodiment, the input buffer further comprises a sampling clock generator that generates the sampling clock signal. The sampling clock generator comprises one of a phase locked loop and a delay locked loop. The sampling clock generator may optionally further comprise: a timing controller that generates the sampling clock signal; and a clock generator that receives a clock signal and generates a plurality of internal clock signals that are provided to the timing controller.

In one embodiment, the equalizer comprises: an equalizing coefficient controller that receives the variable equalizing control signal and, in response, generates a equalization coefficient; a multiplier that multiples the oversampled output signal by the equalization coefficient to generate a product; and a differential amplifier that subtracts the product from the input signal to generate the amplified output signal.

In one embodiment, the oversampled output signal comprises an even oversampled signal and an odd oversampled signal and the equalizer comprises: an equalizing coefficient controller that receives the variable equalizing control signal and, in response, generates a equalization coefficient; a first multiplier that multiples the odd oversampled signal by the equalization coefficient to generate an odd product; a second multiplier that multiples the even oversampled signal by the equalization coefficient to generate an even product; a first differential amplifier that subtracts the odd product from the input signal to generate an even amplified output signal; and a second differential amplifier that subtracts the even product from the input signal to generate an odd amplified output signal.

In another aspect, the present invention is directed to a memory device. The device includes a plurality of addressable memory cells, each cell comprising a data storage element and a decoder that receives an address from an external source, and that generates a row signal and a column signal for accessing at least one of the addressable memory cells. The device further includes a decision feedback equalization (DFE) input buffer. An equalizer amplifies a difference in voltage level between an input signal and an oversampled signal in response to a variable equalizing control signal, the equalizer generating an amplified output signal. A sampling unit samples the amplified output signal in response to a sampling clock signal to generate the oversampled signal. A phase detector generates a timing control signal for controlling the timing of the activation of the sampling clock signal in response to a phase of the oversampled signal. An equalizing controller modifies the variable equalizing control signal in response to the timing control signal.

In another aspect, the present invention is directed to a memory system. The system includes a memory controller that generates command and address signals; and a memory module comprising a plurality of memory devices, the memory module receiving the command and address signals and in response storing and retrieving data to and from the memory device. Each memory device comprises a plurality of addressable memory cells, each cell comprising a data storage element and a decoder that receives an address from an external source, and that generates a row signal and a column signal for accessing at least one of the addressable memory cells. The device further includes a decision feedback equalization (DFE) input buffer. An equalizer amplifies a difference in voltage level between an input signal and an oversampled signal in response to a variable equalizing control signal, the equalizer generating an amplified output signal. A sampling unit samples the amplified output signal in response to a sampling clock signal to generate the oversampled signal. A phase detector generates a timing control signal for controlling the timing of the activation of the sampling clock signal in response to a phase of the oversampled signal. An equalizing controller modifies the variable equalizing control signal in response to the timing control signal.

In another aspect, the present invention is directed to an equalizer that amplifies a difference in voltage level between first and second input signals in response to a variable equalizing control signal. A first current path is provided between a first voltage source and a second voltage source, the first current path including, in series, a first load, a first transistor that is activated in response to a first input signal, and a second transistor that has a first channel width and that is activated in response to a bias voltage. The first current path draws a first current. A second current path is provided between the first voltage source and the second voltage source. The second current path includes in series, a second load, a third transistor that is activated in response to a second input signal, and a transistor bank having a plurality of fourth transistors connected in parallel with each other. Each of the fourth transistors is activated in response to a bit of the equalizing control signal, thereby selectively modifying an effective second channel width of the transistor bank, such that the second current path draws a second current that is variable in response to the variable equalizing control signal, and such that an output signal provided at a junction of the first load and the first transistor is variably amplified in response to the variable second current.

In one embodiment, the first and second loads comprise, for example, load transistors or load resistors.

In one embodiment, the first load and the first transistor are coupled at a first output node, and the second load and the second transistor are coupled at a second output node. A fifth transistor is coupled between the second node and a junction of the first transistor and second transistor and activated in response to an inverted first input signal and a sixth transistor is coupled between the first node and a junction between the third transistor and the transistor bank and activated in response to an inverted second input signal.

In one embodiment, the transistor bank further includes a plurality of seventh transistors, each of the seventh transistors being in series with a corresponding fourth transistor, each of the seventh transistors being activated in response to the bias voltage.

In another aspect, the present invention is directed to a method for equalizing an input signal received at an input buffer. A difference in voltage level between an input signal and an oversampled signal is amplified in response to a variable equalizing control signal and generating an amplified output signal. The amplified output signal is sampled in response to a sampling clock signal to generate the oversampled signal. A timing control signal is generated for controlling the timing of the activation of the sampling clock signal in response to a phase of the oversampled signal. The variable equalizing control signal is modified in response to the timing control signal.

In one embodiment, the amplified output signal comprises an even amplified output signal and an odd amplified output signal; and the oversampled signal comprises a first even oversampled signal, a second even oversampled signal, a first odd oversampled signal and a second odd oversampled signal. The timing control signal is generated by determining whether a phase difference exists between the first even oversampled signal and the second even oversampled signal, and determining whether a phase difference exists between the first odd oversampled signal and the second odd oversampled signal, and, in response, generating a timing control signal comprising a lock signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals.

In another embodiment, modifying the variable equalizing control signal comprises modifying the variable equalizer control signal in response to statuses of the up control signal, the down control signal, and the lock control signal. In another embodiment, modifying the variable equalizing control signal comprises: receiving the up control signal, the down control signal and the lock control signal, and, in response, generating an auxiliary up control signal, and an auxiliary down control signal, the auxiliary up control signal being activated when at least one of the up control signal and down control signal is active, and the auxiliary down control signal being activated when the lock control signal is active; and generating the variable equalizing control signal in response to the auxiliary up control signal and the auxiliary down control signal, by increasing a value of the variable equalizing control signal upon the auxiliary up control signal being active, and by decreasing the value of the variable equalizing control signal upon the auxiliary down control signal being active.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 4:
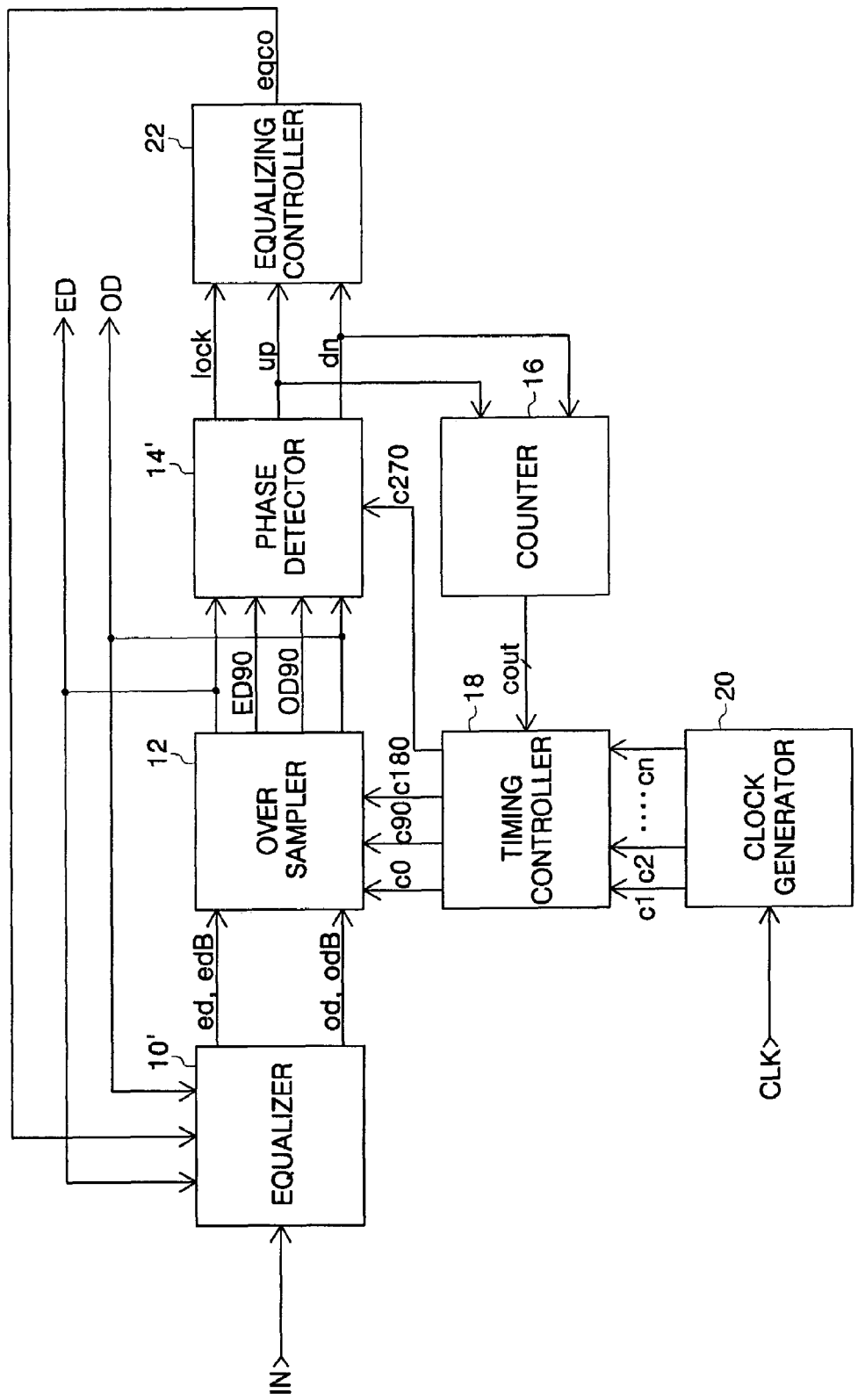
FIG. 4 is a block diagram of a DFE input buffer in accordance with the present invention.

FIG. 4 is a block diagram of a DFE input buffer in accordance with the present invention. In the embodiment of FIG. 4, an equalizer 10' amplifies the difference between an input signal IN including an ISI component, and an odd oversampled output signal OD (or ODB) multiplied by a variable equalization coefficient value β that is determined in response to a received value of an equalizing coefficient control signal eqco, to compensate for the ISI component. As a result, a first even amplified output signal ed, edB is generated. At the same time, the equalizer 10' amplifies the difference between the input signal IN including the ISI component, and an even oversampled output signal ED (or EDB) multiplied by the variable equalization coefficient value β to compensate for the ISI component. As a result, a first odd amplified output signal od, odB is generated. The equalizer 10' thus includes a circuit that generates the even amplified output signals ed/edB and a circuit that generates the odd amplified output signals od/odB.

An oversampler 12 sequentially samples the first even amplified output signal ed/edB in response to each of sampling clock signals c0 and c90 and sequentially generates even oversampled output signals ED and ED90. Also, the oversampler 12 sequentially samples the first odd amplified output signal od/odB in response to each of sampling clock signals c90 and c180 and sequentially generates first and second odd oversampled output signals OD90 and OD. The sampling clock signals c0, c90 and c180 are respectively 90 degrees out-of-phase. The even and odd oversampled output signals ED, OD are output as ISI-compensated signals. The equalizer 10' and the oversampler 12 may optionally be configured as a single, common, circuit block, or, optionally as independent circuit blocks.

The phase detector 14' detects the phase difference between the even oversampled output signals ED and ED90 and detects the phase difference between the odd oversampled output signals OD and OD90, and, in response to a detected phase difference, outputs an up control signal up or a down control signal dn. The phase detector 14' further generates a lock control signal lock when a phase difference does not exist in either the even oversampled output signals ED, ED90, or in the odd oversampled output signals OD, OD90.

An equalizing controller 22 receives the up control signal up, down control signal dn and lock signal lock generated by the phase detector 14', and, in response, generates the equalizing coefficient control signal eqco. In one embodiment, the equalizing coefficient control signal eqco is a digital value comprising a plurality of digital bits. The equalizing controller 22 increases the value of the equalizing coefficient control signal eqco when the up control signal up or down control signal dn is activated. Activation of the up control signal up or down control signal dn is indicative of the existence of timing error and/or voltage error in the input signal in. However, when the lock signal lock is enabled, the value of the equalizing coefficient control signal eqco is decreased by the equalizing controller 22. Activation of the lock signal lock is indicative of the substantial non-existence of voltage error or timing error in the input signal IN. In this manner, the value of the equalizing coefficient control signal eqco is variably controlled and adjusted in response to the received control signals up, dn, lock, which are indicative of whether voltage error or timing error exists in the input signal. This provides for efficient and accurate compensation of timing error and voltage error in the input signal IN, as the value of the equalization coefficient control signal eqco, and therefore the value of the equalization coefficient β, are adjusted in response to whether timing and/or voltage errors exist in the input signal IN.

Figure 1:
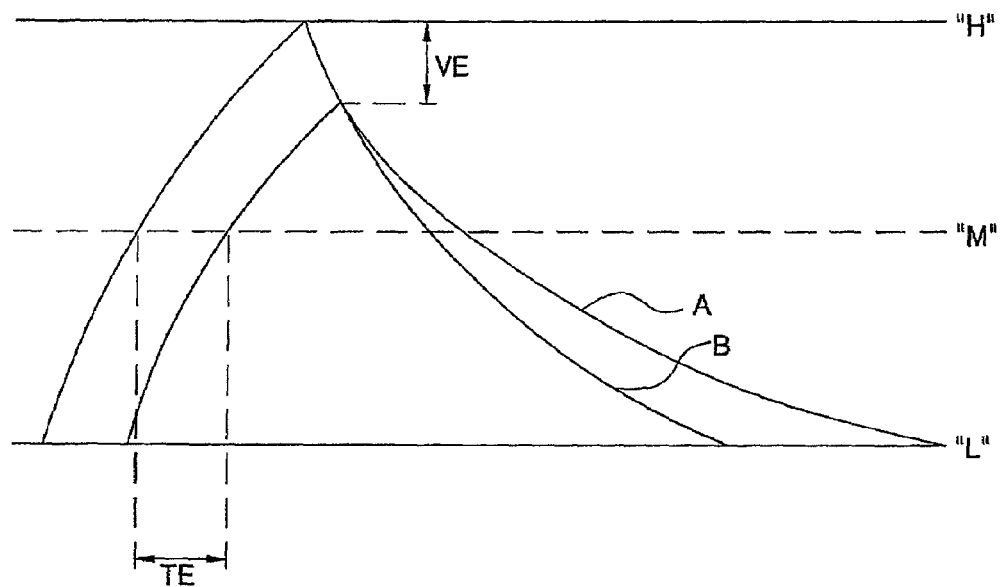
FIG. 1 is a waveform diagram illustrating the effects of timing errors and voltage errors caused by ISI.
Figure 2:
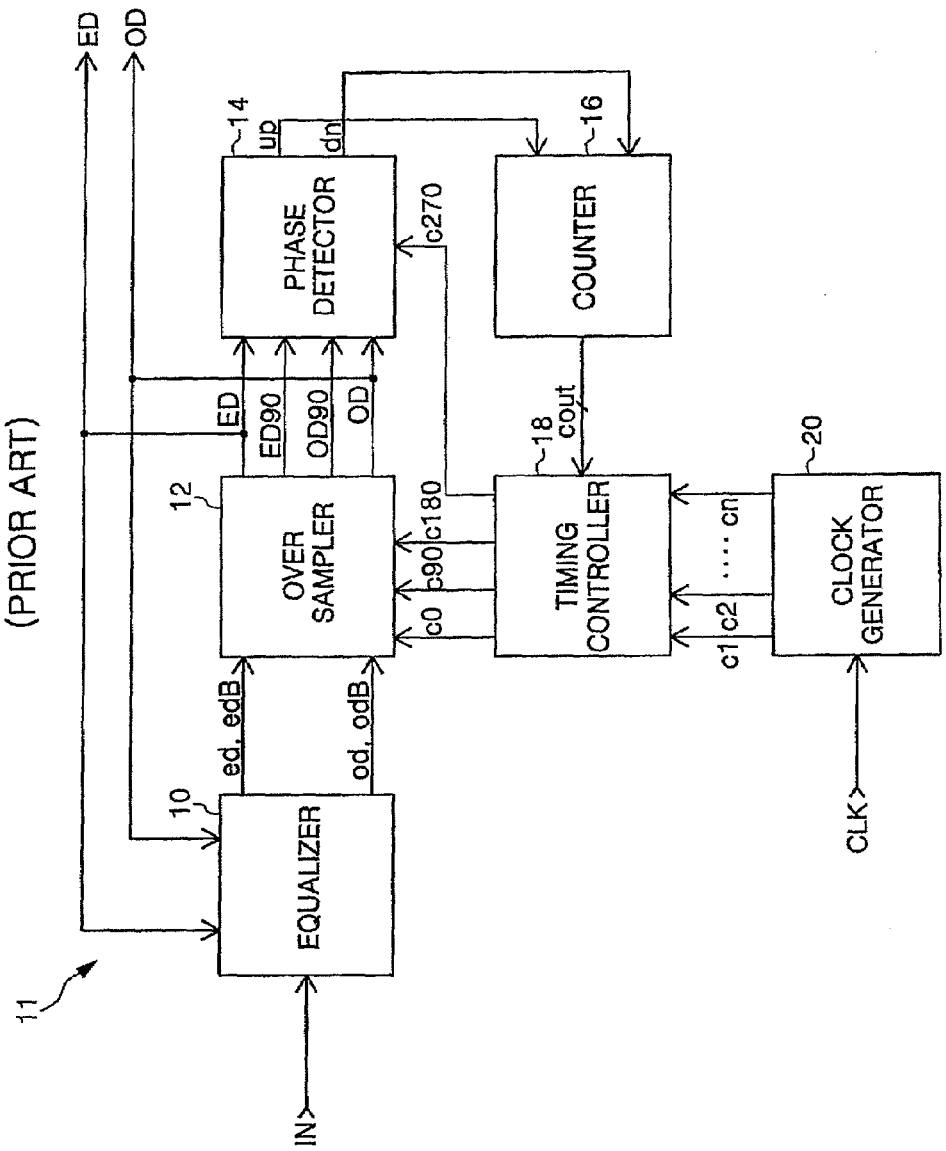
FIG. 2 is a block diagram of a conventional decision feedback equalizer (DFE) input buffer.
Figure 3:
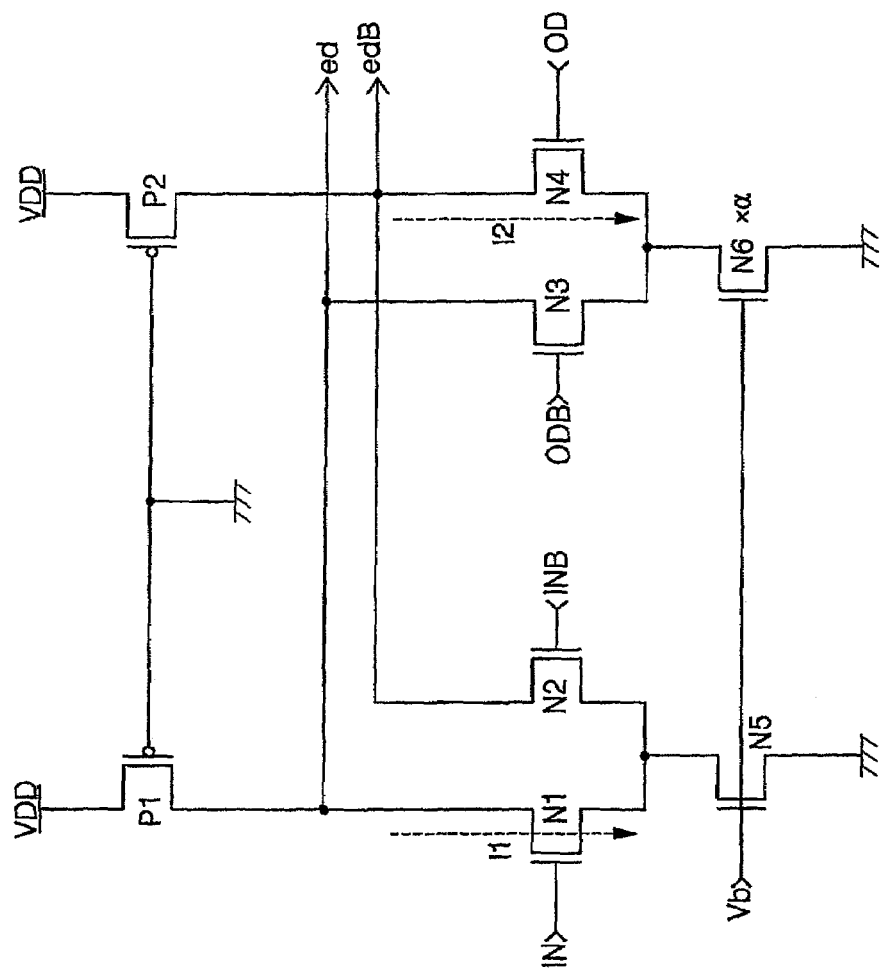
FIG. 3 is a schematic diagram of the equalizer 10 component of the conventional DFE input buffer of FIG. 2.

Counter 16 receives the up control signal up and the down control signal dn from the phase detector 14' and generates a current output signal cout, that is provided to a timing controller 18. The timing controller 18 also receives reference clock signals (c1, c2, ... cn) from reference clock generator 20, which may comprise a phase-locked loop or delay-locked loop, and generates sampling clock signals c0, c90, c180, c270, which are respectively 90 degrees out-of-phase, and the activation timing of which is controlled by the timing controller 18, in response to the count output signal cout. The operation of the counter 16, timing controller 18, and clock generator 20 for the system of the present invention is essentially the same as that of the conventional embodiment discussed above with reference to FIG. 2.

Figure 5:
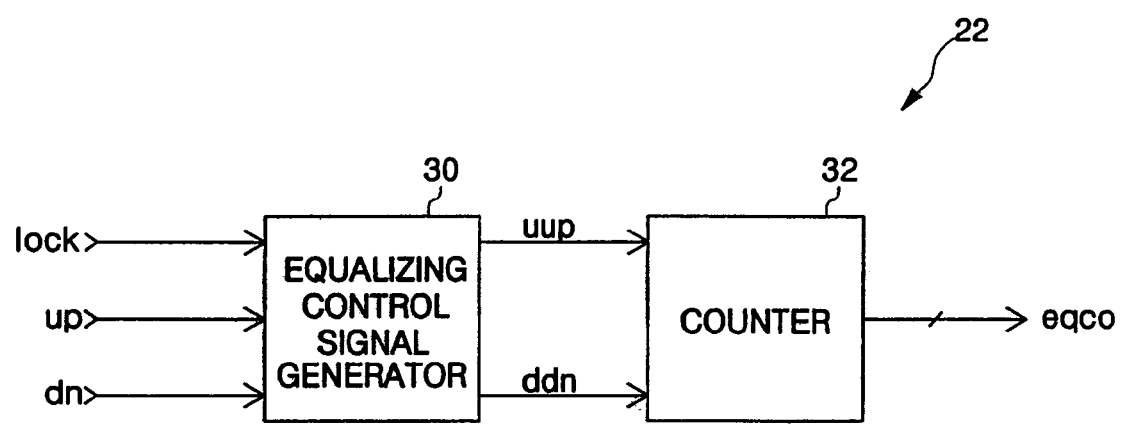
FIG. 5 is a block diagram of the equalizing controller 22 of FIG. 4, in accordance with the present invention.

FIG. 5 is a block diagram of the equalizing controller 22 of FIG. 4, in accordance with the present invention. In this embodiment, the equalizing controller 22 includes an equalizing control signal generator 30 and a counter 32. The equalizing controller 22 receives the up control signal up, down control signal dn and lock signal lock generated by the phase detector 14'. When the up control signal up or the down control signal dn is active, the equalizing controller 30 activates an auxiliary up control signal uup. When the lock signal lock is active, the equalizing controller 30 activates an auxiliary down control signal ddn.

The counter 32 in the equalizing controller 22 generates an increased equalizing coefficient control signal eqco in response to an active auxiliary up control signal uup. Also, the counter 32 generates a decreased equalizing coefficient control signal eqco in response to an active auxiliary down control signal ddn. In this manner, the value of the equalizing coefficient control signal eqco is variable.

Figure 6:
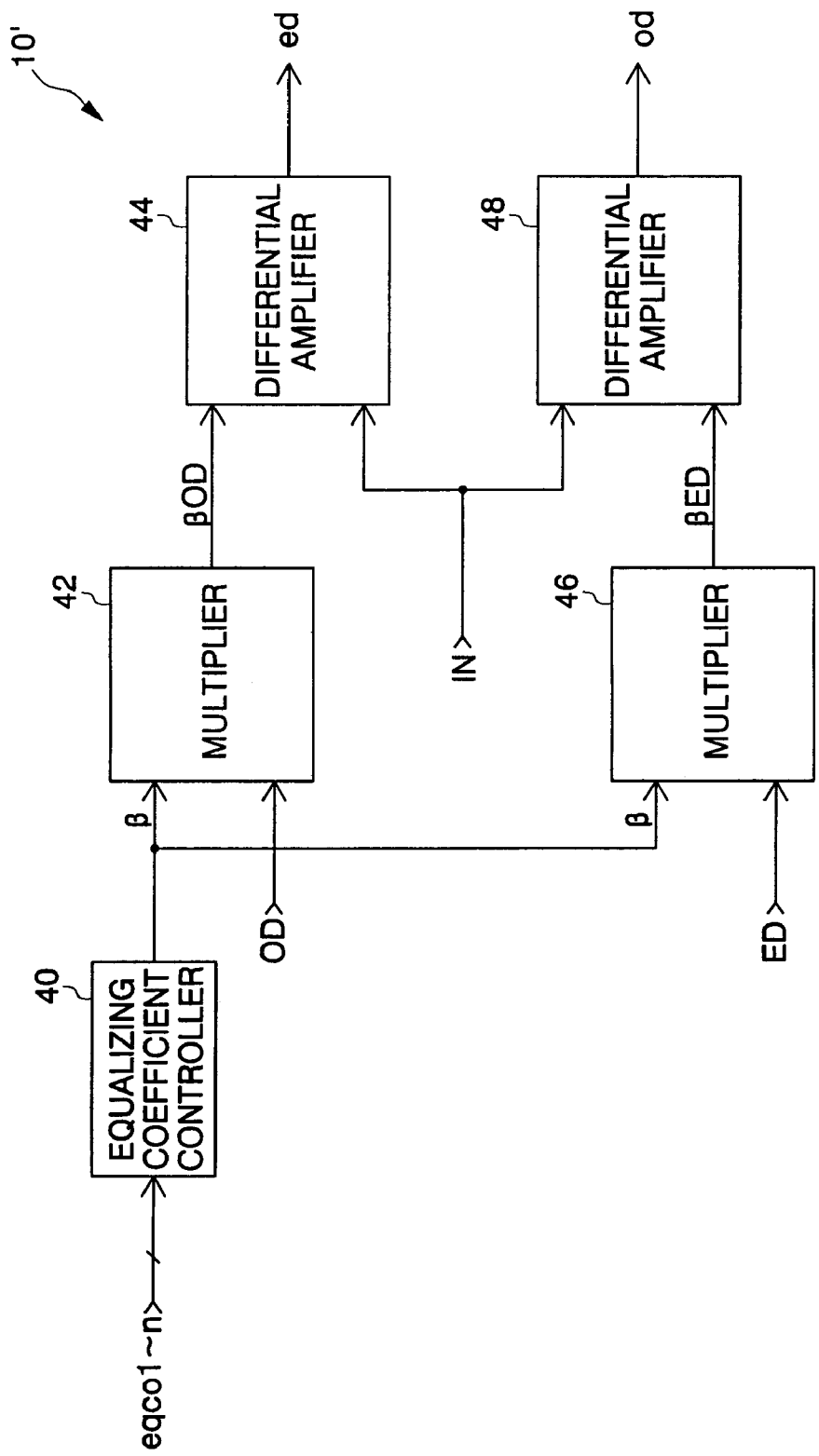
FIG. 6 is a block diagram of the equalizer 10' of FIG. 4, in accordance with the present invention.

FIG. 6 is a block diagram of the equalizer 10' of FIG. 4, in accordance with the present invention. The equalizer 10' includes an equalizing coefficient controller 40, first and second multipliers 42, 46 and first and second differential amplifiers 44, 48. The equalizing coefficient controller 40 receives the binary equalizing coefficient control signal eqco, for example n-bits wide, and, in response, generates the value of the equalizing coefficient β. In this manner, the equalizing coefficient β is variable, as it is generated in response to the variable equalizing coefficient control signal eqco. For this reason, the present invention can accurately compensate for timing and voltage errors in the received input signals over a range of operating conditions, in contrast with the conventional approaches.

In the equalizer 10', the variable equalizing coefficient β is multiplied by the odd oversampled output signal OD at the first multiplier 42 to generate an odd product output signal βOD. Similarly, the variable equalizing coefficient β is multiplied by the second even output signal ED at the second multiplier 46 to generate an even product output signal βED. The first differential amplifier 44 provides the difference between the odd product output signal βOD and the input signal IN to generate the first even amplified output signal ed, and the second differential amplifier 48 provides the difference between the even product output signal βED and the input signal IN to generate the first odd amplified output signal od.

Figure 7A:
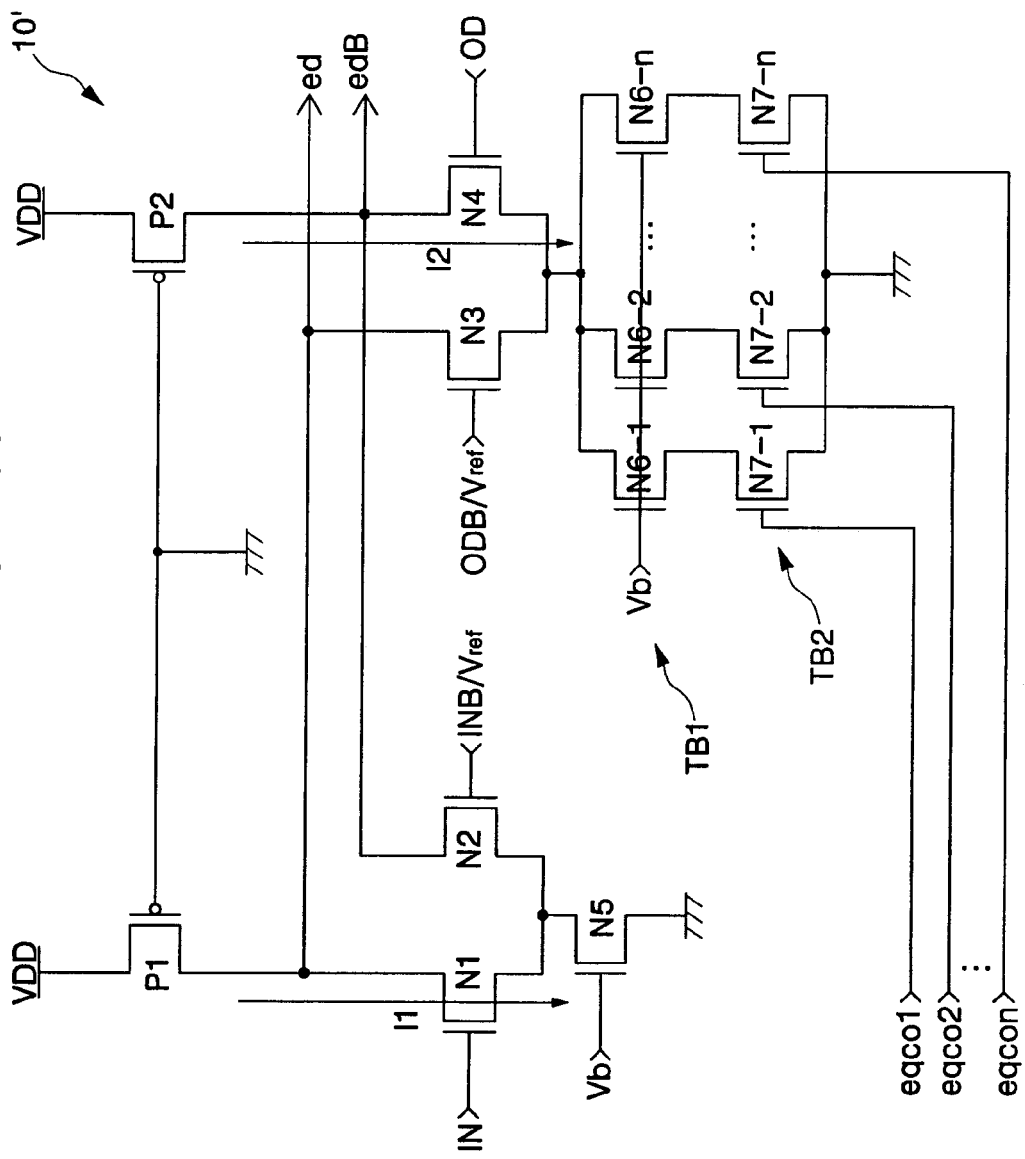
FIGS. 7A and 7B are detailed schematic diagrams of even and odd components of the equalizer 10' of FIG. 4, in accordance with the present invention.
Figure 7B:
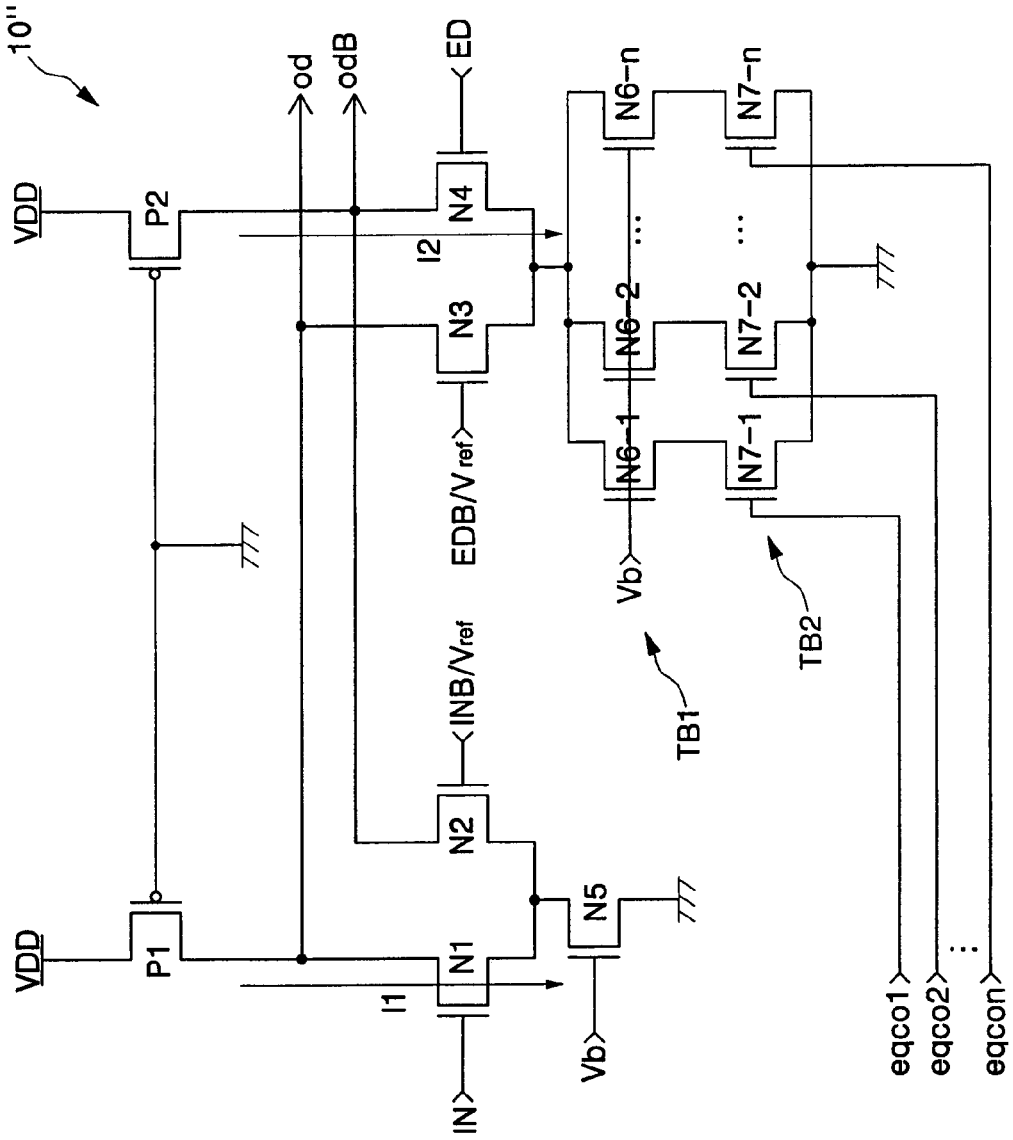

FIGS. 7A and 7B are detailed schematic diagram of the equalizer 10' of FIGS. 4 and 6, in accordance with the present invention. With reference to FIG. 7A, the equalizer 10' includes first and second PMOS transistors P1, P2 and first through fifth NMOS transistors N1, N2, N3, N4, and N5. The equalizer 10' further includes a first transistor bank TB1 of sixth NMOS transistors N6-1 ... N6-n, and a second transistor bank TB2 of seventh NMOS transistors N7-1 ... N7-n. The inputs to the N2 and N3 transistors are the inverted input signal INB and inverted odd oversampled output signal ODB respectively. Each of the first and second PMOS transistors P1, P2 operates as a load resistance, and a predetermined current I1, I2 flows through each transistor P1, P2 respectively. The voltage level of the first even amplified output signal ed is determined according to the current I1 flowing through transistors P1, N1 (responsive to the input signal IN) and N5 (responsive to a bias voltage Vb), and according to the current I2 flowing through transistors P2 and N4 (responsive to the odd oversampled output signal OD) and through the transistors N6-1 ... N6-n of the first transistor bank TB1 and the selectively activated transistors N7-1 ... N7-n of the second transistor bank TB2. The transistors N7-1 ... N7-n of the second transistor bank TB2 are selectively activated in response to the status of the bits of the variable equalizing coefficient control signal eqco. Each corresponding pair of transistors in the first transistor bank TB1 and second transistor bank TB2, for example, transistors N6-1 and N7-1, transistors N6-2 and N7-2, etc., draw current depending on the status (active or inactive) of the corresponding bit of the variable equalizing coefficient control signal eqco. In this manner, the first even amplified output signal ed is generated in response to the amplification of the respective values of the first current I1 and the second current I2. The voltage level of the inverted even amplified output signal edB is similarly determined.

The transistors N6-1 ... N6-n of the first transistor bank TB1 are responsive to the bias voltage Vb, and the transistors N7-1 ... N7-n of the second transistor bank TB2 are responsive to the variable equalizing coefficient control signal eqco. Each transistor N7-1 ... N7-n in the second transistor bank TB2 has a gate that is connected to a corresponding one of the bits of the variable equalizing coefficient control signal eqco. By forming each transistor N7-1 ... N7-n of the second transistor bank TB2 to have a different channel width, and by forming each transistor N6-1 ... N6-n of the first transistor bank TB1 to have a different channel width that corresponds to the respective channel widths of the second transistor bank TB2, then each corresponding pair of series transistors, i.e. N6-1, N7-1, has a different respective current draw. For example, by formulating the respective transistor channel widths of the transistors N7-1 ... N7-n of the second transistor bank TB2 to have a current draw that is a binary multiple of an adjacent transistor, the second current I2, and therefore the corresponding equalizing coefficient β of the equalizer 10', is made to be variably adjusted to have a value that is directly related to the binary value of the variable equalizing coefficient control signal eqco. In this manner, variable control over the system equalizing coefficient β is realized. In an alternative embodiment, the channel widths of each of the transistors N6-1 ... N6-n in the first bank TB1 and the transistors N7-1 ... N7-n in the second bank TB2 can be the same. In this case, the current draws of each transistor is the same, but when additional transistors are activated, the overall current draw is varied to achieve a variable system equalizing coefficient β.

In an alternative embodiment, a reference value voltage Vref may be applied to the gates of transistors N2 and N3, rather than the inverted input signal INB and the inverted odd oversampled output signal ODB respectively.

The equalizer circuit 10' illustrated in FIG. 7A is configured to generate the first even amplified output signals ed, edB. A similarly configured odd equalizer circuit 10" as shown in FIG. 7B can be used to generate the first odd amplified output signals od, odB. Similar first and second transistor banks TB1, TB2 are provided for the odd equalizer circuit 10''', such that the odd amplified output signals od, odB are generated in response to the variable equalizing coefficient control signal ecqo.

Figure 8:
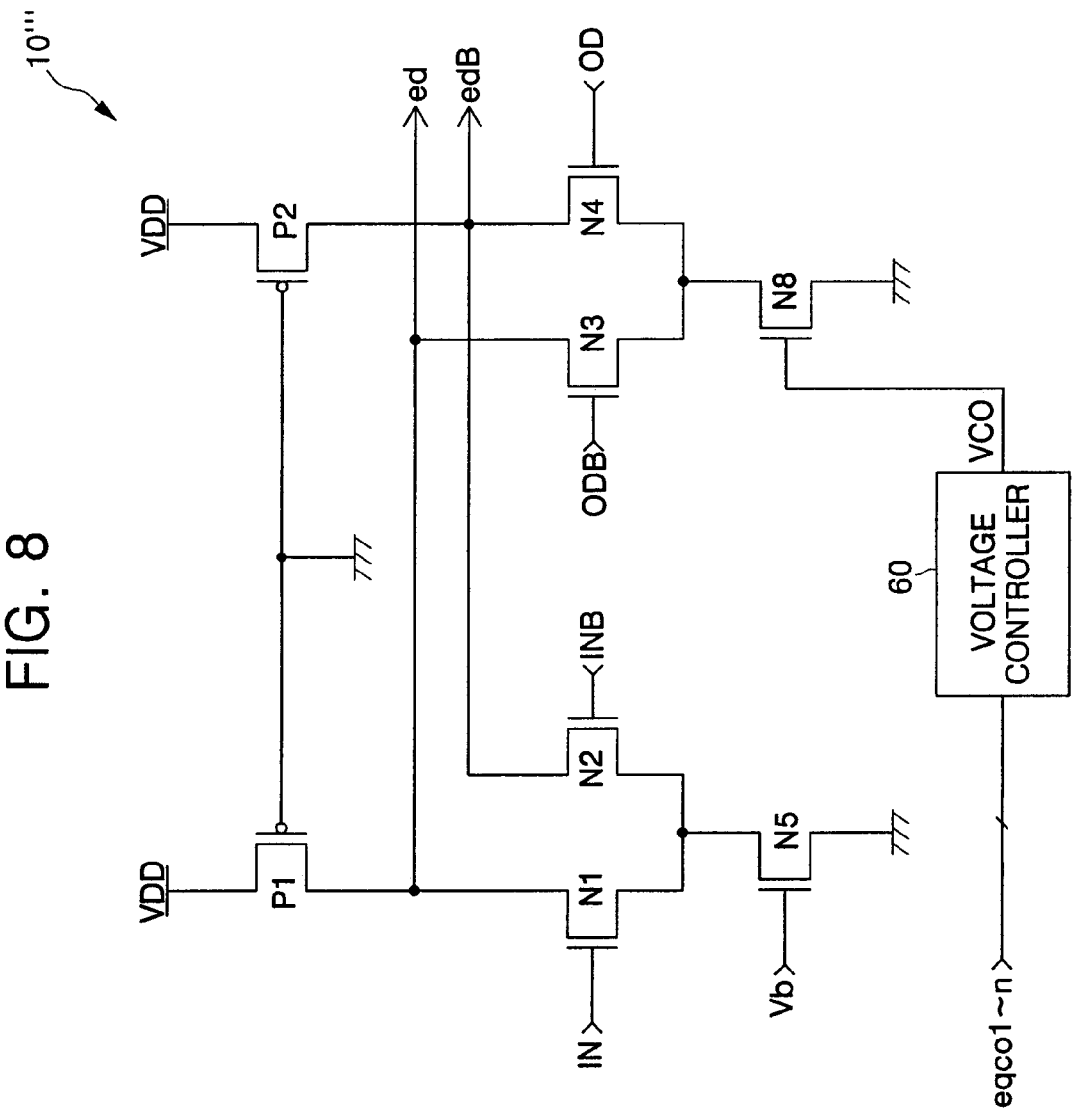
FIG. 8 is a detailed schematic diagram of an alternative embodiment of the equalizer 10' of FIG. 4, in accordance with the present invention.

FIG. 8 is a detailed schematic diagram of an alternative embodiment of the equalizer 10'''' of FIG. 4, in accordance with the present invention. In this embodiment, a single transistor N8 is connected in series between the node connecting transistors N3 and N4 and a ground reference voltage level. A voltage control signal VCO is applied to the gate of the transistor N8. The voltage control signal VCO is variable and the voltage of the voltage control signal VCO is controlled by a voltage control circuit 60 in response to the variable equalizing coefficient control signal eqco. For example, when the variable equalizing coefficient control signal eqco increases, the voltage control circuit 60 responds by raising the voltage level of the voltage control signal VCO. Also, when the variable equalizing coefficient control signal eqco decreases, the voltage control circuit 60 responds by lowering the voltage level of the voltage control signal VCO. The current flowing through transistor N8 is variably controlled based on the variable value of the voltage control signal VCO. This, in turn, allows for variable control over the resulting equalizing coefficient β of the equalizer 10'''', since the equalizing coefficient β value is a direct function of the current flowing through transistor N8, as discussed above.

Figure 9:
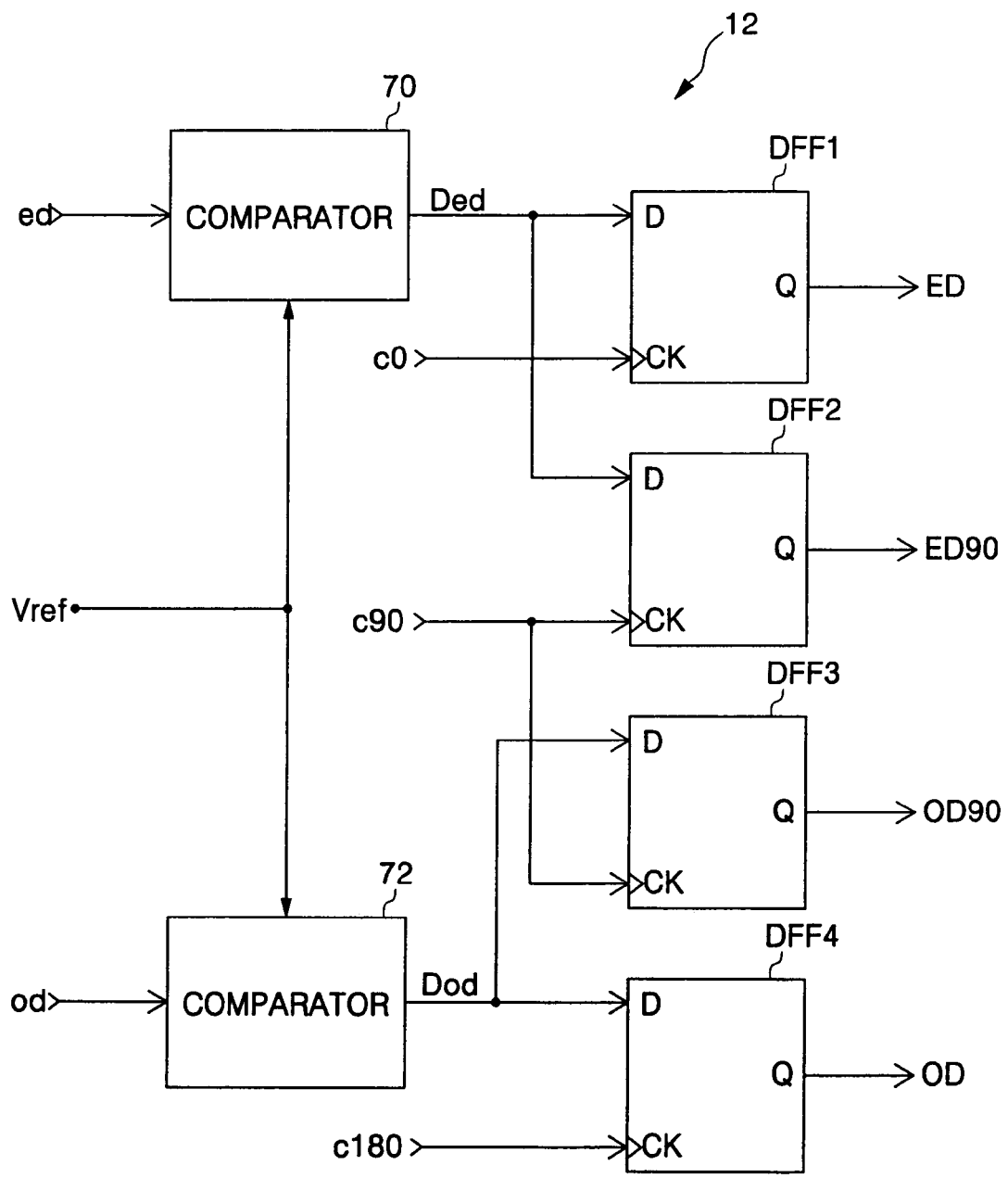
FIG. 9 is a block diagram of an embodiment of the oversampler 12 of FIG. 4, in accordance with the present invention.

FIG. 9 is a block diagram of an embodiment of the oversampler 12 of FIG. 4, in accordance with the present invention. The oversampler 12 comprises first and second comparators 70, 72 and first through fourth D flip-flops DFF1, DFF2, DFF3, DFF4. The first comparator 70 receives and compares the even amplified output signal ed and a reference voltage Vref. When the level of the even amplified output signal ed is greater than that of the reference voltage Vref, the first comparator outputs an even comparison signal Ded at a high level to the first and second D flip flops DFF1, DFF2. The second comparator 72 receives and compares the odd amplified output signal od and the reference voltage Vref. When the level of the odd amplified output signal od is greater than that of the reference voltage Vref, the second comparator outputs an odd comparison signal Dod at a high level to the third and fourth D flip flops DFF3, DFF4.

The first D flip-flop DFF1 latches the even comparison signal Ded in response to a first sampling clock signal c0, and outputs a first even oversampled output signal ED. The second D flip-flop DFF2 latches the even comparison signal Ded in response to a second sampling clock signal c90, and outputs a second even oversampled output signal ED90. In this manner, the first and second even oversampled output signals ED, ED90 are sequentially generated, as the oversampler 12 samples the even comparison signal Ded two times in response to the first and second sampling clocks c0, c90, which are 90 degrees out-of-phase.

In a similar manner, the third D flip-flop DFF3 latches the odd comparison signal Dod in response to the second sampling clock signal c90, and outputs a first odd oversampled output signal OD90. The fourth D flip-flop DFF4 latches the odd comparison signal Dod in response to a third sampling clock signal c180, and outputs a second odd oversampled output signal OD. In this manner, the first and second odd oversampled output signals OD90, OD are sequentially generated, as the oversampler 12 samples the odd comparison signal Dod two times in response to the second and third sampling clocks c90, c180 which are 90 degrees out-of-phase.

Figure 10:
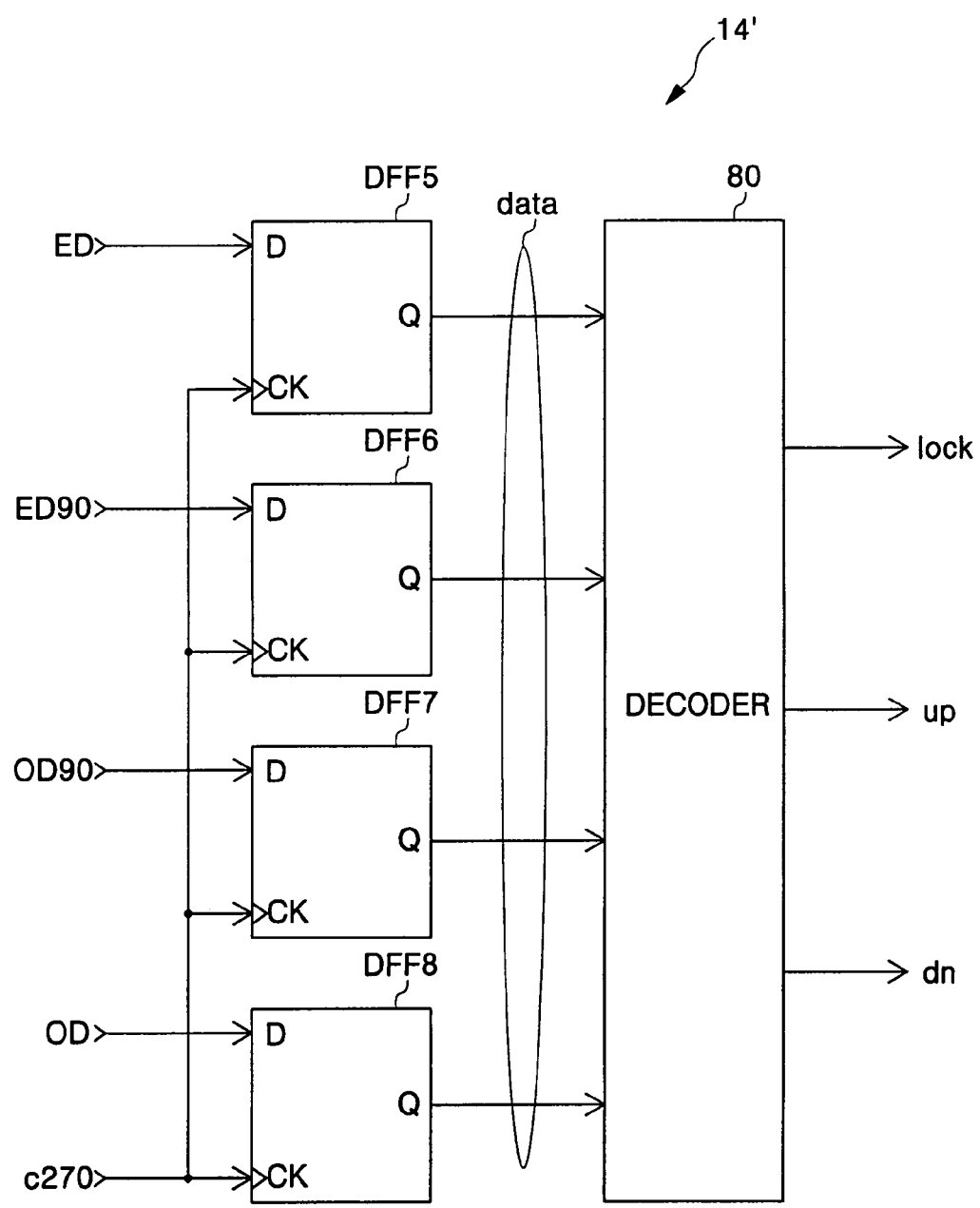
FIG. 10 is a schematic block diagram of the phase detector 14' of FIG. 4, in accordance with the present invention.

FIG. 10 is a schematic block diagram of the phase detector 14' of FIG. 4, in accordance with the present invention. In this embodiment; the phase detector 14' includes fifth, sixth, seventh, and eighth D flip-flops DFF5, DFF6, DFF7, and DFF8 and a decoder 80. The fifth D flip-flop DFF5 samples the first even oversampled output signal ED in response to the third sampling clock c270. The sixth D flip-flop DFF6 samples the second even oversampled output signal ED90 in response to the third sampling clock c270. The seventh D flip-flop DFF7 samples the first odd oversampled output signal OD90 in response to the third sampling clock c270. The eighth D flip-flop DFF8 samples the second odd oversampled output signal OD in response to the third sampling clock c270. While the phase detector 14' in the above example utilizes the c270 sampling clock for sampling the even and odd oversampled output signals ED, ED90, OD, OD90, any of the other sampling clocks, for example c0, c90, or c180 may be used for this purpose. Alternatively, a clock received from an external terminal may also be used.

The output data signals data of each of the fifth, sixth, seventh, and eighth D flip-flops DFF5, DFF6, DFF7, and DFF8 are provided to decoder 80, which, in response, generates three control signals, an up control signal up, a down control signal dn, and a lock control signal lock. In one embodiment, when the phase of the sampling clock c0, c90, c180 leads the phase of the input data signal IN, the up control signal up is activated by the decoder 80. When the phase of the sampling clock c0, c90, c180 lags the phase of the input data signal IN, the down control signal dn is activated by the decoder 80. When the phases of the sampling clocks and the input signal IN are aligned, the lock control signal lock is activated by the decoder 80.

The operation of the decoder 80 of FIG. 10 will now be discussed with reference to the timing diagrams of FIGS. 11A, 11B, and 11C which illustrate the conditions under which a lock control signal lock, a down control signal dn, and an up control signal up are generated, respectively.

For example, assuming that the input data signal (IN) is continuously input with data '0110', a valid value of the first even amplified output signal ed is '0', while a valid value of the second even amplified output signal ed is '1', as output by the equalizer (10' or 10'' or 10'''). On the other hand, still assuming such input data, a valid value of the first odd amplified output signal od is '1', while a valid value of the second odd amplified output signal od is '0', as output by the equalizer (10' or 10'' or 10'''). Thus, the order of the even input data ed is '01', while the order of the odd input data od is '10'. Accordingly, with reference to FIG. 11A, at the first rising edge of the third sampling clock c270, the data signal data has a value of '0011'. The data signal data is presented to the decoder 80, which determines that the first even oversampled output signal ED and the second even oversampled output signal ED90 have the same value (in this example, '0'). Because each of the first and second even oversampled output signals ED and ED90 is data sampled from the same even data, namely the first even data ed having a '0' value, then the values of ED and ED90 are identical. The decoder 80 similarly also determines that the second odd oversampled output signal OD and the first odd oversampled output signal OD90 have the same value ('1'). Because each of the first and second odd oversampled output signals OD90 and OD is data sampled from same the odd data, namely the first odd data od having a '1' value, then the values of OD and OD90 are identical. In response to this determination, the lock control signal lock is enabled by the decoder 80 because both of ED and ED90 have the same data value (0) and both of OD and OD90 have the same data value (1).

Also, at the second rising edge of the third sampling clock c270, the data signal data has a value of '1100'. The data signal data is presented to the decoder 80, which determines that the first even oversampled output signal ED and the second even oversampled output signal ED90 have the same value (in this example, '1'). Because each of the first and second even oversampled output signals ED and ED90 is data sampled from the same even data, namely the second even data ed having a '1' value, then the values of ED and ED90 are identical. The decoder 80 similarly determines that the second odd oversampled output signal OD and the first odd oversampled output signal OD90 have the same value ('0'). Because each of the first and second odd oversampled output signals OD90 and OD is data sampled from same the odd data, namely the second odd data od having a '0' value, then the values of OD and OD90 are identical. In response to this determination, the lock control signal lock is continuously enabled by the decoder 80 because both of ED and ED90 have the same data value (1) and both of OD and OD90 have the same data value (0). In other words, valid data is being output, which confirms that the rising edge of the c0 clock is located at an appropriate position relative to the input even data ed, for example at the center of the even data ed and the rising edge of the c180 clock is located at an appropriate position relative to the input odd data od, for example at the center of the odd input data od.

Figure 11A:
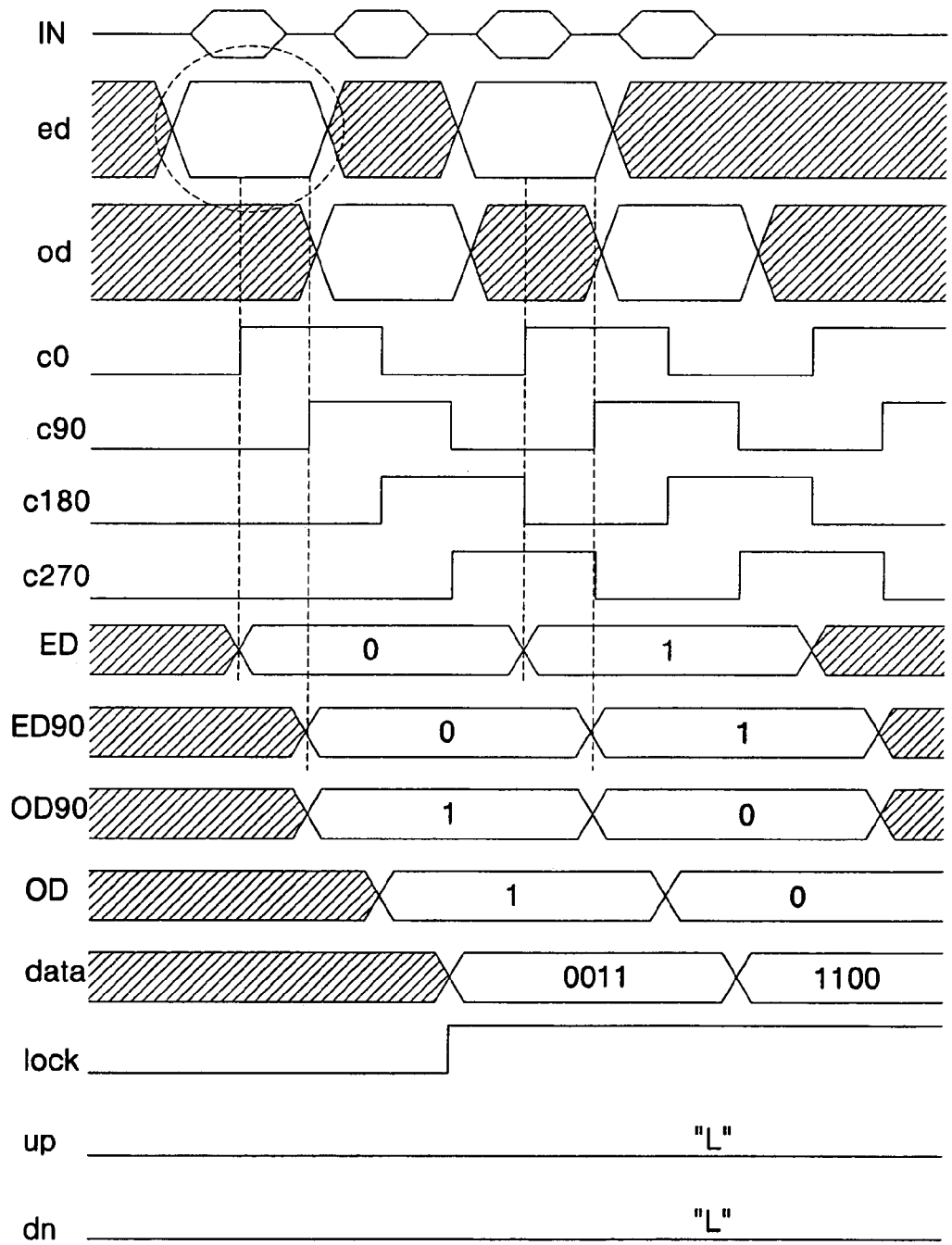
FIGS. 11A, 11B, and 11C are timing diagrams that illustrate the conditions under which a lock control signal lock, a down control signal dn, and an up control signal up are generated, respectively, in accordance with the present invention.

Assuming that the input data signal (IN) is continuously input with data '1001', unlike the input data of FIG. 11A, a valid value of the first even amplified output signal ed is '1', while a valid value of the second even amplified output signal ed is '0', as output by the equalizer (10' or 10" or 10'"). On the other hand, still assuming such input data, a valid value of the first odd amplified output signal od is '0', while a valid value of the second odd amplified output signal od is '1', as output by the equalizer (10' or 10" or 10'"). Thus, the order of the even input data ed is '10', while the order of the odd input data od is '01'. Accordingly, with reference to FIG. 11B, at the first rising edge of the third sampling clock c270, the data signal data has a value of '1000' though the actual value of the data signal data should be a value of '1100'. The data signal data is presented to the decoder 80, which determines that the first even oversampled output signal ED and the second even oversampled output signal ED90 have a different data value ('1' and '0'), and also determines that the first odd oversampled output signal OD90 and the second odd output signal OD have the same data value ('0'). In response to this determination, the down control signal dn is enabled by the decoder 80 in order to move the rising edge of the c0 clock more toward the center of the even data signal ed. Activation of the down control signal dn causes the activation of the sampling clock signals c0, c90, c180 at an earlier time by the timing controller 18, as described above. Also, at the second rising edge of the third sampling clock c270, the data signal data has a value of '0111' though the actual value of the data signal data should be a value of '0011'. The data signal data is presented to the decoder 80, which determines that the first even oversampled output signal ED and the second even oversampled output signal ED90 have a different data value ('0' and '1'), and also determines that the first odd oversampled output signal OD90 and the second odd output signal OD have the same data value ('1'). In response to this determination, the down control signal dn is continuously enabled by the decoder 80 in order to move the rising edge of c0 clock more toward the center of the even data signal ed.

Figure 11B:
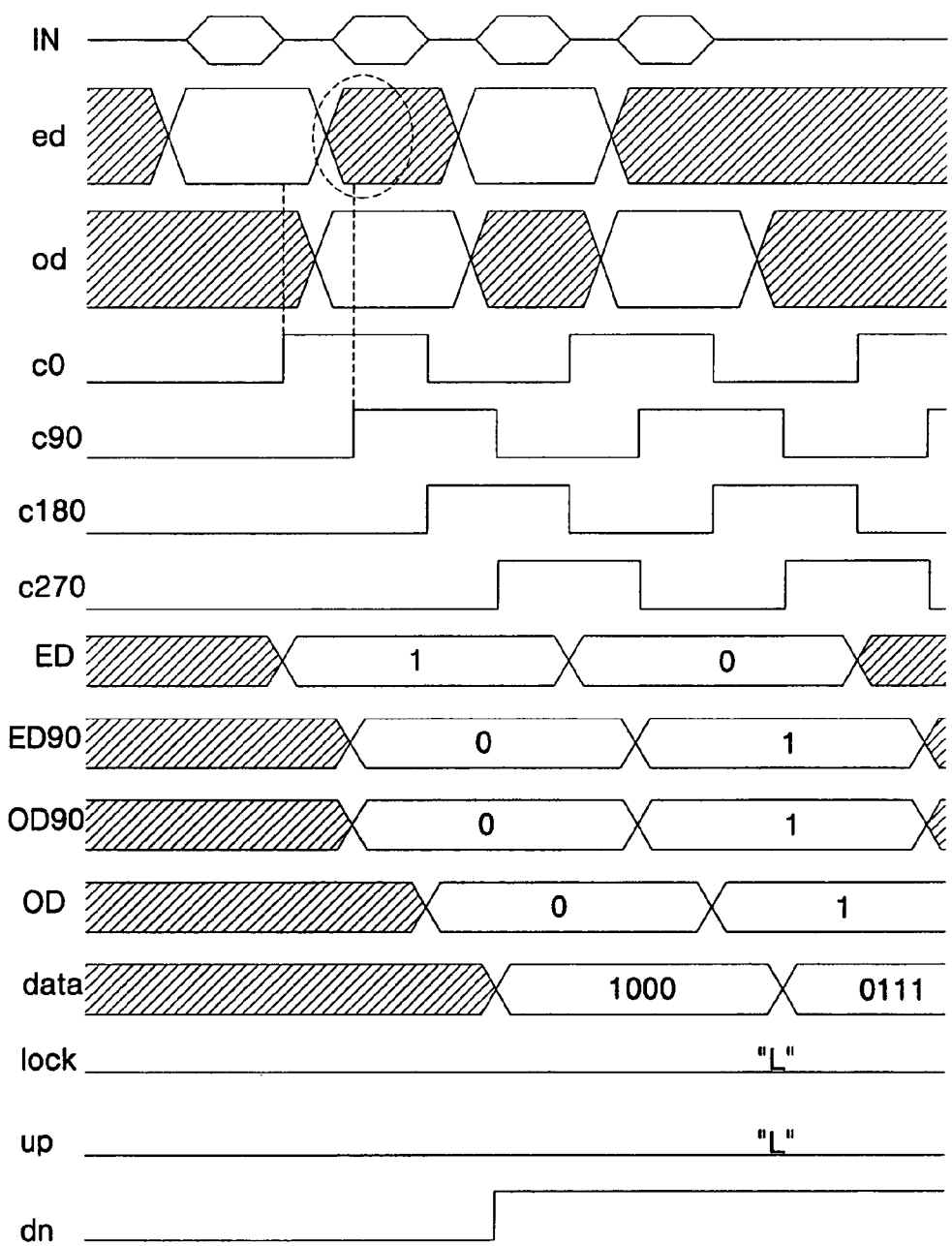
Figure 11C:
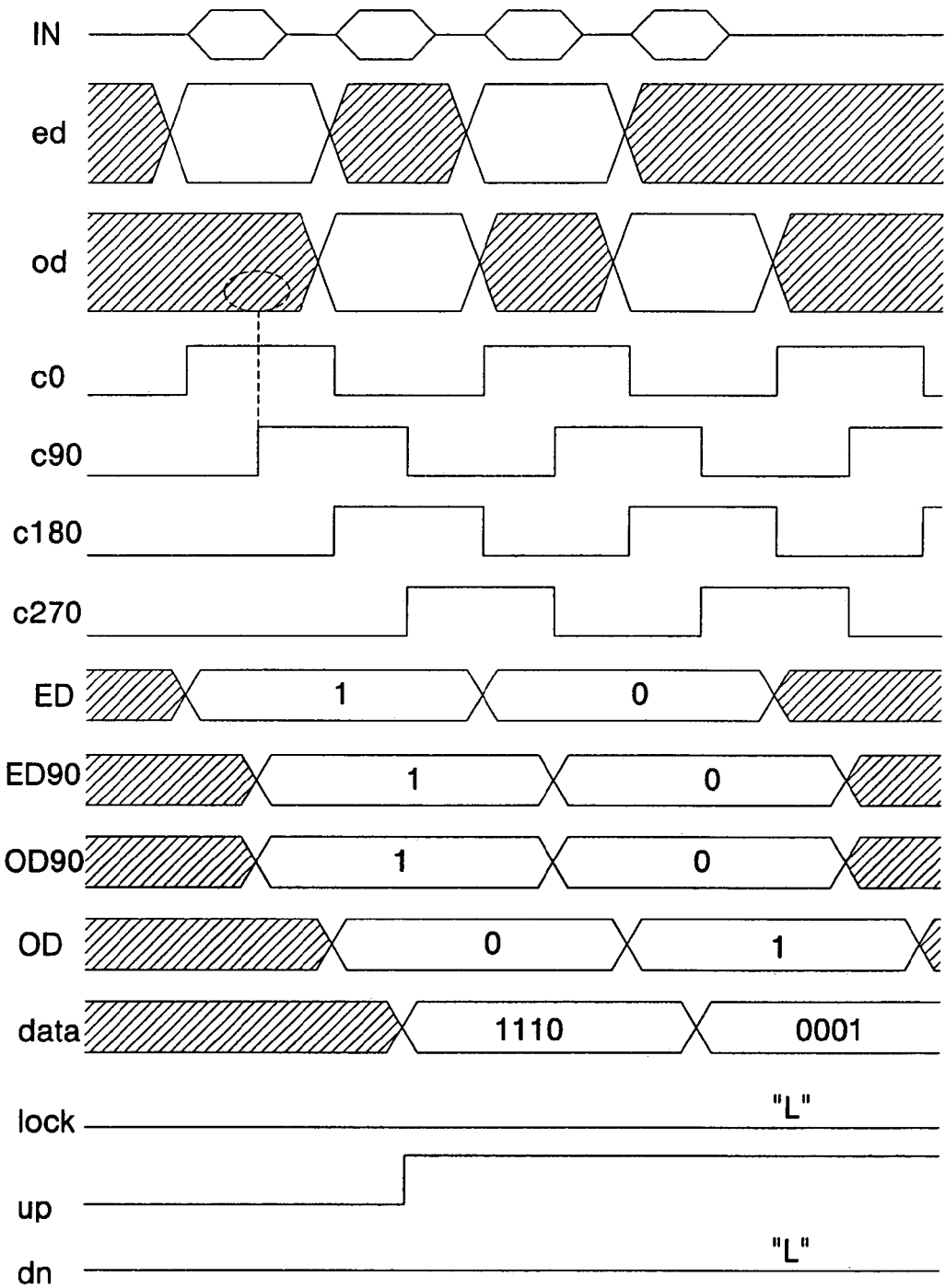

Assuming that the input data signal (IN) is continuously input with data '1001', as in FIG. 11B, a valid value of the first even amplified output signal ed is '1', while a valid value of the second even amplified output signal ed is '0', as output by the equalizer (10' or 10" or 10'"). On the other hand, still assuming such input data, a valid value of the first odd amplified output signal od is '0', while a valid value of the second odd amplified output signal od is '1', as output by the equalizer (10' or 10" or 10'"). Thus, the order of the even input data ed is '10', while the order of the odd input data od is '01'. Accordingly, with reference to FIG. 11C, at the first rising edge of the third sampling clock c270, the data signal data has a value of '1110' though the actual value of the data signal data should be a value of '1100'. The data signal data is presented to the decoder 80, which determines that the first even oversampled output signal ED and the second even oversampled output signal ED90 have the same data value ('1'), and also determines that the first odd oversampled output signal OD90 and the second odd oversampled output signal OD have different data values ('1' and '0'), In response to this determination, the up control signal up is enabled by the decoder 80 in order to move the rising edge of the c180 clock more toward the center of the odd data signal od. Activation of the up control signal up causes the activation of the sampling clock signals c0, c90, c180 at a later time by the timing controller 18, as described above. Also, at the second rising edge of the third sampling clock c270, the data signal data has a value of '0001' though the actual value of the data signal data should be a value of '0011'. The data signal data is presented to the decoder 80, which determines that the first even oversampled output signal ED and the second even oversampled output signal ED90 have the same data value ('0'), and also determines that the first odd oversampled output signal OD90 and the second odd oversampled output signal OD have different data values ('0' and '1'), In response to this determination, the up control signal up is continuously enabled by the decoder 80 in order to move the rising edge of c180 clock more toward the center of the odd data signal od. Activation of the up control signal up causes the activation of the sampling clock signals c0, c90, c180 at a later time by the timing controller 18, as described above FIG. 12 is a block diagram of an alternative embodiment of the DFE input buffer of the present invention. In this embodiment, the equalizer 10" generates a single serial amplified output signal in in response to the input signal IN, rather than both the even and odd amplified output signals ed, od as generated by the equalizer 10' of the above-described embodiment. In this case, only a single equalization circuit 10' is needed, as shown in FIG. 7. In addition, only a single oversampled output signal ain1 is fed back to the equalizer 10", along with the equalizing coefficient control signal eqco, generated by controller 22. The single serial amplified output signal in may, for example, correspond with the even component of the signal.

Figure 12:
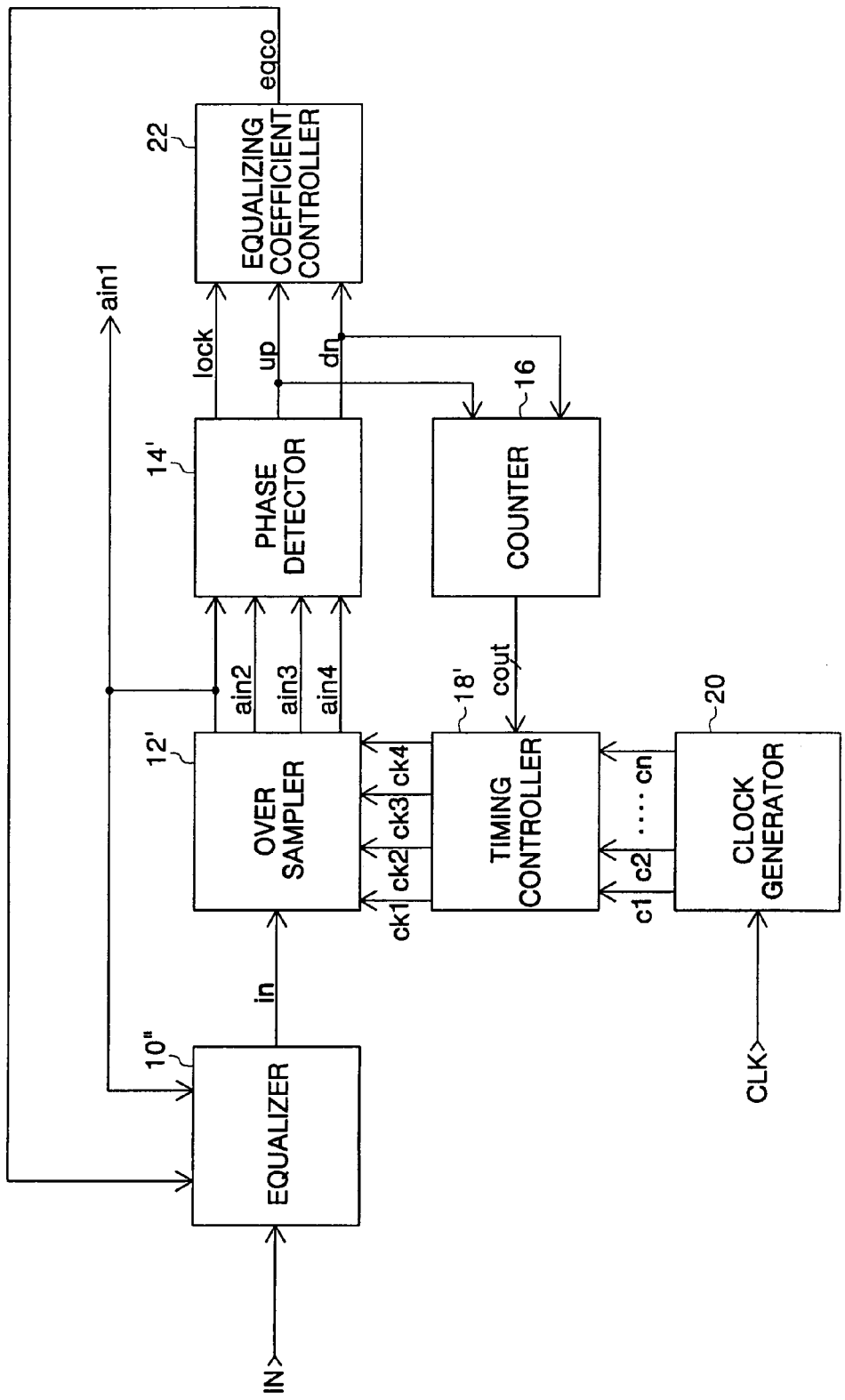
FIG. 12 is a block diagram of an alternative embodiment of the DFE input buffer of the present invention.

In addition, in the embodiment of FIG. 12, the timing controller 18' generates a plurality of sampling clock signals ck1, ck2, ck3, ck4 that are generated sequentially in response to the reference clock signals c1, c2, . . . cn generated at the clock generator 20. As in the above-described embodiment, the timing of the sampling clock signals is controlled at the timing controller 18' in response to the count output signal cout of the counter 16. In the embodiment illustrated, the sampling clock signals ck1, ck2, ck3, ck4 are four in number and correspond to four clock signals c0, c90, c180, c270 that are respectively 90 degrees out-of-phase, as in the above-described embodiment. Also, in this embodiment, all sampling clock signals ck1, ck2, ck3, ck4, including the fourth sampling clock signal ck4, are provided to the oversampler 12' which in response, provides first through fourth oversampled output signals ain1, ain2, ain3, ain4. The first through fourth oversampled output signals ain1, ain2, ain3, ain4 are presented to the phase detector 14', which performs a function similar to the phase detector 14' described above with reference to FIG. 10, thereby generating the lock control signal lock that is provided to the equalizing coefficient controller 22, and the up control signal up and down control signal dn, that are provided to the equalizing coefficient controller 22 and the counter 16, as described above.

While the circuit of the FIG. 4 embodiment above employs a double data rate approach, which interleaves the data using even and odd branches, in applications where the input data rate is low compared to the processing rate capability of the input buffer circuit, the time interleaving approach is not required. Assuming this, the configuration of FIG. 12 can be employed. This configuration offers the advantage of a single input branch, which simplifies the hardware configuration and reduces the amount of consumed circuit area and fabrication expense.

In this manner, a decision feedback equalization (DFE) buffer is provided in which timing and voltage errors are fully compensated. By utilizing a variable equalization coefficient β in the equalizer component, timing and voltage errors are compensated for over a range of operating conditions. This leads to improved signal reliability and higher achievable inter-circuit transfer rates.

The present invention is applicable to integrated circuits of all types, including memory devices and memory systems. In a memory device embodiment, the memory device includes a plurality of addressable memory cells, each cell comprising a data storage element. A decoder receives an address from an external source, and that generates a row signal and a column signal for accessing at least one of the addressable memory cells. A decision feedback equalization (DFE) input buffer can be provided on the memory device for receiving signals that are transmitted from external, off-chip sources.

Figure 13:
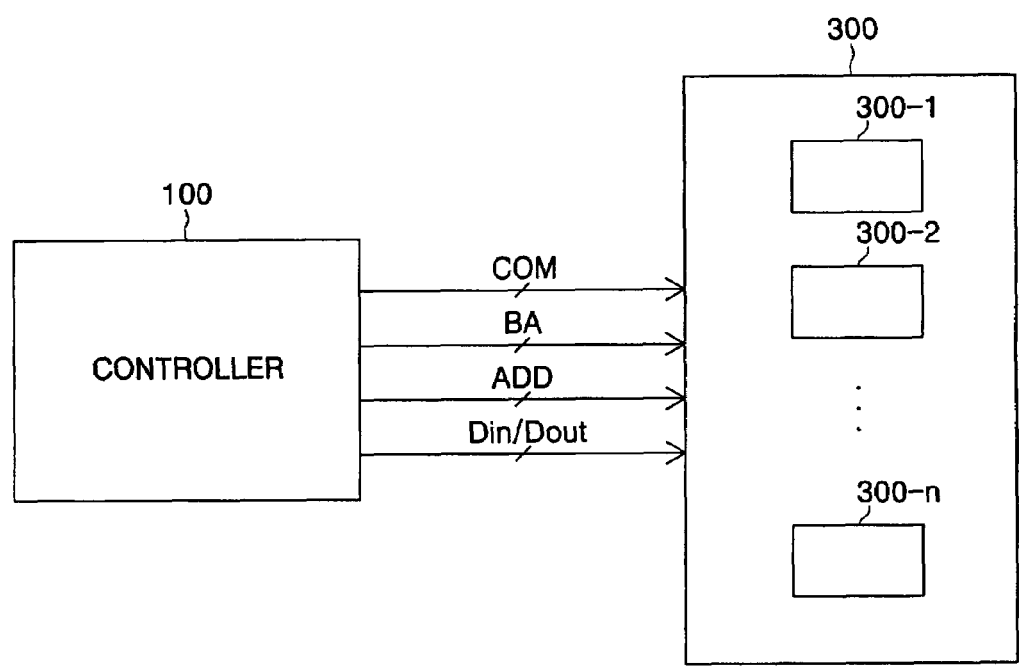
FIG. 13 is a block diagram of a memory system in accordance with the present invention.

FIG. 13 is a block diagram of a memory system in accordance with the present invention. The memory system includes a memory controller 100 that generates command (COM) and address signals (BA (bank address) and ADD) and a memory module 300. The memory module 300 comprises a plurality of memory devices 300-1, 300-2, ..., 300-n, and receives the command (COM) and address signals (BA, ADD). In response, the memory module 300 stores and retrieves data (Din/Dout) to and from the memory devices 300-1, 300-2, ..., 300-n. A decision feedback equalization (DFE) input buffer in accordance with the present invention can be provided on the memory devices for receiving signals that are transmitted from external, off-chip sources.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A decision feedback equalization (DFE) input buffer, comprising:
    an equalizer that amplifies a difference in voltage level between an input signal and an oversampled signal in response to a variable equalizing control signal, the equalizer generating an amplified output signal;
    a sampling unit that samples the amplified output signal in response to a sampling clock signal to generate the oversampled signal;
    a phase detector that generates a timing control signal for controlling the timing of the activation of the sampling clock signal in response to a phase of the oversampled signal; and
    an equalizing controller coupled to the phase detector, wherein the equalizing controller receives the timing control signal from the phase detector, and wherein the equalizing controller modifies the variable equalizing control signal in response to the timing control signal.

2. The decision feedback equalization (DFE) input buffer of claim 1 wherein the equalizer generates an even amplified output signal and an odd amplified output signal as the amplified output signal.

3. The decision feedback equalization (DFE) input buffer of claim 2 wherein the sampling unit samples the even amplified output signal with a first sampling clock and a second sampling clock, the first and second sampling clocks being 90 degrees out-of-phase with respect to each other, and, in response, generates a first even oversampled signal and a second even oversampled signal and wherein the sampling unit samples the odd amplified output signal with the second sampling clock and a third sampling clock, the second and third sampling clocks being 90 degrees out-of-phase with respect to each other, and, in response, generates a first odd oversampled signal and a second odd oversampled signal.

4. The decision feedback equalization (DFE) input buffer of claim 3 wherein the phase detector determines whether a phase difference exists between the first even oversampled signal and the second even oversampled signal, and determines whether a phase difference exists between the first odd oversampled signal and the second odd oversampled signal, and, in response, generates the timing control signal.

5. The decision feedback equalization (DFE) input buffer of claim 4 wherein the phase detector determines whether a phase difference exists between the first even oversampled signal and the second even oversampled signal, and determines whether a phase difference exists between the first odd oversampled signal and the second odd oversampled signal in response to one of the first sampling clock, the second sampling clock, the third sampling clock, and a fourth sampling clock that is 90 degrees out-of-phase with the third sampling clock.

6. The decision feedback equalization (DFE) input buffer of claim 4 wherein the timing control signal comprises a lock control signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals.

7. The decision feedback equalization (DFE) input buffer of claim 6 wherein the equalizing controller adjusts the variable equalizing control signal in response to statuses of the up control signal, the down control signal, and the lock control signal.

8. The decision feedback equalization (DFE) input buffer of claim 6 wherein the equalizing controller comprises:
    an equalizing control signal generator that receives the up control signal, the down control signal and the lock control signal, and, in response, generates an auxiliary up control signal, and an auxiliary down control signal, the auxiliary up control signal being activated when at least one of the up control signal and down control signal is active, and the auxiliary down control signal being activated when the lock control signal is active; and
    a counter that receives the auxiliary up control signal and the auxiliary down control signal, and, in response, generates the variable equalizing control signal, the counter increasing a value of the variable equalizing control signal upon the auxiliary up control signal being active, and the counter decreasing the value of the variable equalizing control signal upon the auxiliary down control signal being active.

9. The decision feedback equalization (DFE) input buffer of claim 1
wherein the amplified output signal comprises an even amplified output signal and an odd amplified output signal; and wherein the oversampled signal comprises a first even oversampled signal, a second even oversampled signal, a first odd oversampled signal and a second odd oversampled signal;
and wherein the phase detector determines whether a phase difference exists between the first even oversampled signal and the second even oversampled signal, and determines whether a phase difference exists between the first odd oversampled signal and the second odd oversampled signal, and, in response, generates the timing control signal comprising a lock signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals.

10. The decision feedback equalization (DFE) input buffer of claim 9 wherein the equalizing controller modifies the variable equalizer control signal in response to statuses of the up control signal, the down control signal, and the lock control signal.

11. The decision feedback equalization (DFE) input buffer of claim 9 wherein the equalizing controller comprises:
an equalizing control signal generator that receives the up control signal, the down control signal and the lock control signal, and, in response, generates an auxiliary up control signal, and an auxiliary down control signal, the auxiliary up control signal being activated when at least one of the up control signal and down control signal is active, and the auxiliary down control signal being activated when the lock control signal is active; and
a counter that receives the auxiliary up control signal and the auxiliary down control signal, and, in response, generates the variable equalizing control signal, the counter increasing a value of the variable equalizing control signal upon the auxiliary up control signal being active, and the counter decreasing the value of the variable equalizing control signal upon the auxiliary down control signal being active.

12. The decision feedback equalization (DFE) input buffer of claim 1, wherein the equalizing control signal comprises a digital signal having a plurality of bits, and wherein the equalizer includes a transistor bank including a plurality of transistors, each of the transistors being activated in response to a bit of the equalizing control signal, such that the amplified output signal is variably amplified in response to activation statuses of the respective transistors of the transistor bank.

13. The decision feedback equalization (DFE) input buffer of claim 1 wherein the equalizing control signal comprises a digital signal having a plurality of bits, and wherein the equalizer comprises:
a first transistor, one of a source and drain of which is coupled to a first voltage source and the other of the source and drain of which is coupled to a first node;
a second transistor and a third transistor coupled in series between the first node and a second voltage source, the second transistor being activated in response to the input signal and the third transistor being activated in response to a first reference voltage; and
a fourth transistor and a transistor bank coupled in series between the first node and the second voltage source, the fourth transistor being activated in response to an inverted oversampled signal, the transistor bank including a plurality of fifth transistors connected in parallel with each other, each of the fifth transistors being activated in response to a bit of the equalizing control signal, such that the amplified output signal provided at the first node is variably amplified in response to activation statuses of the respective fifth transistors of the transistor bank.

14. The decision feedback equalization (DFE) input buffer of claim 13 wherein the transistor bank further includes a plurality of sixth transistors, each of the sixth transistors being in series with a corresponding fifth transistor, each of the sixth transistors being activated in response to the first reference voltage.

15. The decision feedback equalization (DFE) input buffer of claim 13 wherein the fifth transistors have different respective channel widths.

16. The decision feedback equalization (DFE) input buffer of claim 13 further comprising:
a seventh transistor, one of a source and drain of which is coupled to the first voltage source and the other of the source and drain of which is coupled to a second node, and a gate of which is coupled to a gate of the first transistor and to the second voltage source;
an eighth transistor coupled between the second node and a junction between the second transistor and the third transistor; and
a ninth transistor coupled between the second node and a junction between the fourth transistor and the transistor bank.

17. The decision feedback equalization (DFE) input buffer of claim 16 wherein the amplified output signal comprises an even amplified output signal and an odd amplified output signal, wherein the even amplified output signal is provided at the first node, and wherein an inverted signal of the even amplified output signal is provided at the second node.

18. The decision feedback equalization (DFE) input buffer of claim 16 wherein the eighth transistor is activated in response to an inverted input signal and wherein the ninth transistor is activated in response to an inverted oversampled signal.

19. The decision feedback equalization (DFE) input buffer of claim 16 wherein the eighth transistor is activated in response to a second reference voltage.

20. The decision feedback equalization (DFE) input buffer of claim 13 wherein the amplified output signal is provided at the first node and the second node.

21. The decision feedback equalization (DFE) input buffer of claim 1 wherein the equalizing control signal comprises a digital signal having a plurality of bits, and wherein the equalizer comprises:
a first transistor, one of a source and drain of which is coupled to a first voltage source and the other of the source and drain of which is coupled to a first node;
a second transistor and a third transistor coupled in series between the first node and a second voltage source, the second transistor being activated in response to the input signal and the third transistor being activated in response to a reference voltage;
a fourth transistor and a fifth transistor coupled in series between the first node and the second voltage source, the fourth transistor being activated in response to the oversampled signal, the fifth transistor having a variable current draw in response to a voltage control signal; and a voltage controller for providing the voltage control signal in response to the equalizing control signal.

22. The decision feedback equalization (DFE) input buffer of claim 21 further comprising:

a sixth transistor, one of a source and drain of which is coupled to the first voltage source and the other of the source and drain of which is coupled to a second node, and a gate of which is coupled to a gate of the first transistor and to the second voltage source;

an seventh transistor coupled between the second node and a junction between the second transistor and the third transistor; and an eighth transistor coupled between the second node and a junction between the fourth transistor and the fifth transistor.

23. The decision feedback equalization (DFE) input buffer of claim 1 wherein the sampling unit comprises:

a comparator that compares the amplified output signal to a reference voltage and generates a comparison signal;

a first sampling register that samples the comparison signal in response to a first sampling clock signal to generate a first oversampled signal; and a second sampling register that samples the comparison signal in response to a second sampling clock signal that has a different phase than the first sampling clock signal to generate a second oversampled signal; wherein the first and second oversampled output signals comprise the oversampled signal.

24. The decision feedback equalization (DFE) input buffer of claim 23 wherein the phase detector comprises:

a first detecting register that samples the first oversampled signal in response to a detector sampling clock signal to generate a first bit of a phase detector data signal;

a second detecting register that samples the second oversampled signal in response to the detector sampling clock signal to generate a second bit of a phase detector data signal; and a decoder for generating the timing control signal in response to the first and second bits of the phase detector data signal.

25. The decision feedback equalization (DFE) input buffer of claim 1 wherein the amplified output signal comprises even and odd amplified output signals and wherein the sampling unit comprises:

a first comparator that compares the even amplified output signal to a reference voltage and generates a first comparison signal;

a first sampling register that samples the first comparison signal in response to a first sampling clock signal to generate a first even oversampled signal;

a second sampling register that samples the first comparison signal in response to a second sampling clock signal that has a different phase than the first sampling clock signal to generate a second even oversampled signal;

a second comparator that compares the odd amplified output signal to a reference voltage and generates a second comparison signal;

a third sampling register that samples the second comparison signal in response to the second sampling clock signal to generate a first odd oversampled signal; and a fourth sampling register that samples the second comparison signal in response to a third sampling clock signal that has a different phase than the second sampling clock signal to generate a second odd oversampled signal.

26. The decision feedback equalization (DFE) input buffer of claim 25 wherein the phase detector comprises:

a first detecting register that samples the first even oversampled signal in response to a detector sampling clock signal to generate a first bit of the phase detector data signal;

a second detecting register that samples the second even oversampled signal in response to the detector sampling clock signal to generate a second bit of the phase detector data signal;

a third detecting register that samples the first odd oversampled signal in response to the detector sampling clock signal to generate a third bit of the phase detector data signal;

a fourth detecting register that samples the second odd oversampled signal in response to the detector sampling clock signal to generate a fourth bit of the phase detector data signal; and a decoder for generating the timing control signal in response to the phase detector data signal.

27. The decision feedback equalization (DFE) input buffer of claim 26 wherein the timing control signal comprises a lock control signal, an up control signal, and a down control signal, the lock control signal being active when values of the first and second bits are equal and values of the third and fourth bits are equal, the down control signal being active when values of the first and second bits are not equal and values of the third and fourth bits are equal, and the up control signal being active when values of the first and second bits are equal and values of the third and fourth bits are not equal.

28. The decision feedback equalization (DFE) input buffer of claim 1 further comprising a sampling clock generator that generates the sampling clock signal.

29. The decision feedback equalization (DFE) input buffer of claim 28 wherein the sampling clock generator comprises one of a phase locked loop and a delay locked loop.

30. The decision feedback equalization (DFE) input buffer of claim 28 wherein the sampling clock generator comprises:

a timing controller that generates the sampling clock signal; and a clock generator that receives a clock signal and generates a plurality of internal clock signals that are provided to the timing controller.

31. The decision feedback equalization (DFE) input buffer of claim 1 wherein the equalizer comprises:

an equalizing coefficient controller that receives the variable equalizing control signal and, in response, generates a equalization coefficient;

a multiplier that multiples the oversampled output signal by the equalization coefficient to generate a product; and a differential amplifier that subtracts the product from the input signal to generate the amplified output signal.

32. The decision feedback equalization (DFE) input buffer of claim 1 wherein the oversampled output signal comprises an even oversampled signal and an odd oversampled signal and wherein the equalizer comprises:

an equalizing coefficient controller that receives the variable equalizing control signal and, in response, generates a equalization coefficient;

a first multiplier that multiples the odd oversampled signal by the equalization coefficient to generate an odd product;

a second multiplier that multiples the even oversampled signal by the equalization coefficient to generate an even product;

a first differential amplifier that subtracts the odd product from the input signal to generate an even amplified output signal; and a second differential amplifier that subtracts the even product from the input signal to generate an odd amplified output signal.

33. A memory device comprising:

a plurality of addressable memory cells, each cell comprising a data storage element;

a decoder that receives an address from an external source, and that generates a row signal and a column signal for accessing at least one of the addressable memory cells; and a decision feedback equalization (DFE) input buffer, comprising:

an equalizer that amplifies a difference in voltage level between an input signal and an oversampled signal in response to a variable equalizing control signal, the equalizer generating an amplified output signal;

a sampling unit that samples the amplified output signal in response to a sampling clock signal to generate the oversampled signal;

a phase detector that generates a timing control signal for controlling the timing of the activation of the sampling clock signal in response to a phase of the oversampled signal; and an equalizing controller coupled to the phase detector, wherein the equalizing controller receives the timing control signal from the phase detector, and wherein the equalizing controller modifies the variable equalizing control signal in response to the timing control signal.

34. The memory device of claim 33 wherein the amplified output signal comprises an even amplified output signal and an odd amplified output signal; and wherein the oversampled signal comprises a first even oversampled signal, a second even oversampled signal, a first odd oversampled signal and a second odd oversampled signal;

and wherein the phase detector determines whether a phase difference exists between the first even oversampled signal and the second even oversampled signal, and determines whether a phase difference exists between the first odd oversampled signal and the second odd oversampled signal, and, in response, generates a timing control signal comprising a lock signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals.

35. The memory device of claim 34 wherein the amplified output signal comprises an even amplified output signal and an odd amplified output signal that are serially output by the equalizer.

36. The memory device of claim 34 wherein equalizer comprises first and second equalizers and wherein the amplified output signal comprises an even amplified output signal that is output by the first equalizer and an odd amplified output signal that is output by the second equalizer in parallel with the even amplified output signal.

37. The memory device of claim 34 wherein the equalizing controller modifies the variable equalizer control signal in response to statuses of the up control signal, the down control signal, and the lock control signal.

38. The memory device of claim 34 wherein the equalizing controller comprises:

an equalizing control signal generator that receives the up control signal, the down control signal and the lock control signal, and, in response, generates an auxiliary up control signal, and an auxiliary down control signal, the auxiliary up control signal being activated when at least one of the up control signal and down control signal is active, and the auxiliary down control signal being activated when the lock control signal is active; and a counter that receives the auxiliary up control signal and the auxiliary down control signal, and, in response, generates the variable equalizing control signal, the counter increasing a value of the variable equalizing control signal upon the auxiliary up control signal being active, and the counter decreasing the value of the variable equalizing control signal upon the auxiliary down control signal being active.

39. The memory device of claim 33, wherein the equalizing control signal comprises a digital signal having a plurality of bits, and wherein the equalizer includes transistor bank including a plurality of transistors, each of the transistors being activated in response to a bit of the equalizing control signal, such that the amplified output signal is variably amplified in response to activation statuses of the respective transistors of the transistor bank.

40. A memory system comprising:

a memory controller that generates command and address signals; and a memory module comprising a plurality of memory devices, the memory module receiving the command and address signals and in response storing and retrieving data to and from the memory device, wherein each memory device comprises:

a plurality of addressable memory cells, each cell comprising a data storage element;

a decoder that receives an address from an external source, and that generates a row signal and a column signal for accessing at least one of the addressable memory cells; and a decision feedback equalization (DFE) input buffer, comprising:

an equalizer that amplifies a difference in voltage level between an input signal and an oversampled signal in response to a variable equalizing control signal, the equalizer generating an amplified output signal;

a sampling unit that samples the amplified output signal in response to a sampling clock signal to generate the oversampled signal;

a phase detector that generates a timing control signal for controlling the timing of the activation of the sampling clock signal in response to a phase of the oversampled signal; and an equalizing controller coupled to the phase detector, wherein the equalizing controller receives the timing control signal from the phase detector, and wherein the equalizing controller modifies the variable equalizing control signal in response to the timing control signal.

41. The memory system of claim 40
wherein the amplified output signal comprises an even amplified output signal and an odd amplified output signal; and wherein the oversampled signal comprises a first even oversampled signal, a second even oversampled signal, a first odd oversampled signal and a second odd oversampled signal;

and wherein the phase detector determines whether a phase difference exists between the first even oversampled signal and the second even oversampled signal, and determines whether a phase difference exists between the first odd oversampled signal and the second odd oversampled signal, and, in response, generates a timing control signal comprising a lock signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals.

42. The memory system of claim 41 wherein the equalizing controller modifies the variable equalizer control signal in response to statuses of the up control signal, the down control signal, and the lock control signal.

43. The memory system of claim 41 wherein the equalizing controller comprises:

an equalizing control signal generator that receives the up control signal, the down control signal and the lock control signal, and, in response, generates an auxiliary up control signal, and an auxiliary down control signal, the auxiliary up control signal being activated when at least one of the up control signal and down control signal is active, and the auxiliary down control signal being activated when the lock control signal is active; and a counter that receives the auxiliary up control signal and the auxiliary down control signal, and, in response, generates the variable equalizing control signal, the counter increasing a value of the variable equalizing control signal upon the auxiliary up control signal being active, and the counter decreasing the value of the variable equalizing control signal upon the auxiliary down control signal being active.

44. The memory system of claim 40, wherein the equalizing control signal comprises a digital signal having a plurality of bits, and wherein the equalizer includes transistor bank including a plurality of transistors, each of the transistors being activated in response to a bit of the equalizing control signal, such that the amplified output signal is variably amplified in response to activation statuses of the respective transistors of the transistor bank.

45. An equalizer that amplifies a difference in voltage level between first and second input signals in response to a variable equalizing control signal comprising:

a first current path between a first voltage source and a second voltage source, the first current path including, in series, a first load, a first transistor that is activated in response to a first input signal, and a second transistor that has a first channel width and that is activated in response to a bias voltage, the first current path drawing a first current;

a second current path between the first voltage source and the second voltage source, the second current path including, in series, a second load, a third transistor that is activated in response to a second input signal, and a transistor bank having a plurality of fourth transistors connected in parallel with each other, each of the fourth transistors being activated in response to a bit of the equalizing control signal, thereby selectively modifying an effective second channel width of the transistor bank, such that the second current path draws a second current that is variable in response to the variable equalizing control signal, and such that an output signal provided at a junction of the first load and the first transistor is variably amplified in response to the variable second current.

46. The equalizer of claim 45 wherein the first and second loads comprise load transistors.

47. The equalizer of claim 45 wherein the first and second loads comprise load resistors.

48. The equalizer of claim 45 wherein the first load and the first transistor are coupled at a first output node, and wherein the second load and the second transistor are coupled at a second output node, and further comprising a fifth transistor coupled between the second node and a junction of the first transistor and second transistor and activated in response to an inverted first input signal and a sixth transistor coupled between the first node and a junction between the third transistor and the transistor bank and activated in response to an inverted second input signal.

49. The equalizer of claim 45 wherein the transistor bank further includes a plurality of seventh transistors, each of the seventh transistors being in series with a corresponding fourth transistor, each of the seventh transistors being activated in response to the bias voltage.

50. A method for equalizing an input signal received at an input buffer, comprising:

amplifying a difference in voltage level between the input signal and an oversampled signal in response to a variable equalizing control signal and generating an amplified output signal;

sampling the amplified output signal in response to a sampling clock signal to generate the oversampled signal;

generating a timing control signal for controlling the timing of the activation of the sampling clock signal in response to a phase of the oversampled signal; and receiving a timing control signal from a phase detector and modifying the variable equalizing control signal in response to the timing control signal.

51. The method of claim 50
wherein the amplified output signal comprises an even amplified output signal and an odd amplified output signal; and wherein the oversampled signal comprises a first even oversampled signal, a second even oversampled signal, a first odd oversampled signal and a second odd oversampled signal;

and wherein generating a timing control signal comprises determining whether a phase difference exists between the first even oversampled signal and the second even oversampled signal, and determining whether a phase difference exists between the first odd oversampled signal and the second odd oversampled signal, and, in response, generating a timing control signal comprising a lock signal, an up control signal, and a down control signal, the lock control signal being active when no phase difference exists between the first and second even oversampled signals and when no phase difference exists between the first and second odd oversampled signals, the down control signal being active when a phase difference exists between the first and second even oversampled signals, and the up control signal being active when a phase difference exists between the first and second odd oversampled signals.

52. The method of claim 51 wherein modifying the variable equalizing control signal comprises modifying the variable equalizer control signal in response to statuses of the up control signal, the down control signal, and the lock control signal.

53. The method of claim 51 wherein modifying the variable equalizing control signal comprises receiving the up control signal, the down control signal and the lock control signal, and, in response, generating an auxiliary up control signal, and an auxiliary down control signal, the auxiliary up control signal being activated when at least one of the up control signal and down control signal is active, and the auxiliary down control signal being activated when the lock control signal is active; and generating the variable equalizing control signal in response to the auxiliary up control signal and the auxiliary down control signal, by increasing a value of the variable equalizing control signal upon the auxiliary up control signal being active, and by decreasing the value of the variable equalizing control signal upon the auxiliary down control signal being active.

* * * * *